(12) United States Patent
Moss et al.

(10) Patent No.: US 12,302,062 B2
(45) Date of Patent: May 13, 2025

(54) VIBRATION ENERGY PROJECTION DEVICES AND SYSTEMS

(71) Applicant: The Commonwealth of Australia, Edinburgh SA (AU)

(72) Inventors: Scott Moss, Edinburgh SA (AU); Mason Paxevanos, Edinburgh SA (AU)

(73) Assignee: The Commonwealth of Australia, Edinburgh (AU)

( * ) Notice: Subject to any disclaimer, the term of this patent is extended or adjusted under 35 U.S.C. 154(b) by 191 days.

(21) Appl. No.: 17/774,802

(22) PCT Filed: Mar. 5, 2021

(86) PCT No.: PCT/AU2021/050198
§ 371 (c)(1),
(2) Date: May 5, 2022

(87) PCT Pub. No.: WO2021/174316
PCT Pub. Date: Sep. 10, 2021

(65) Prior Publication Data
US 2022/0400348 A1    Dec. 15, 2022

(30) Foreign Application Priority Data

Mar. 5, 2020    (AU) ................................. 2020900680

(51) Int. Cl.
*H04R 17/00*        (2006.01)
*B06B 1/06*         (2006.01)
(Continued)

(52) U.S. Cl.
CPC ......... *H04R 17/005* (2013.01); *B06B 1/0607* (2013.01); *G01S 7/521* (2013.01);
(Continued)

(58) Field of Classification Search
CPC   H04R 17/005; H04R 2499/13; B06B 1/0607; B06B 1/0644; B06B 1/12;
(Continued)

(56) References Cited

U.S. PATENT DOCUMENTS 5,347,186 A      9/1994  Konotchik
6,624,539 B1 *   9/2003  Hansen ................. H10N 35/00
                                              310/26
(Continued)

FOREIGN PATENT DOCUMENTS

EP         0443873       8/1991
EP         1001512       5/2000
(Continued)

OTHER PUBLICATIONS

Nakano et al., "A portable generator using vibration due to human walking," 2002, 4 pages.
(Continued)

*Primary Examiner* — Oyesola C Ojo
(74) *Attorney, Agent, or Firm* — Hanley, Flight & Zimmerman, LLC

(57) ABSTRACT

Some embodiments relate to an energy transduction device or apparatus. An example device or apparatus includes: a piezoelectric transducer; electrical conductors electrically coupled to the piezoelectric transducer; and an axially aligned magnet assembly arranged to apply static compressive force to the piezoelectric transducer, the magnet assembly being coupled to a base at one end and having a free opposite end. The magnet assembly is coaxial with the piezoelectric transducer and at least part of the magnet assembly is concentric with the piezoelectric transducer. The magnet assembly defines a gap between axially adjacent parts of the magnet assembly, wherein the gap is dimensioned to be sufficiently small that the magnet assembly (Continued)

applies a static compressive force to the piezoelectric transducer while being sufficiently large to allow for axial movement of the piezoelectric transducer without closing the gap.

38 Claims, 12 Drawing Sheets

(51) Int. Cl.
  *G01S 7/521* (2006.01)
  *G01S 15/87* (2006.01)
  *G01S 15/89* (2006.01)
  *H10N 30/853* (2023.01)
(52) U.S. Cl.
  CPC .......... *G01S 15/87* (2013.01); *H10N 30/8554* (2023.02); *G01S 15/89* (2013.01); *H04R 2499/13* (2013.01)
(58) Field of Classification Search
  CPC .......... G01S 7/521; G01S 15/87; G01S 15/89; H10N 30/8554; H10N 30/85; H10N 30/886; H10N 30/30; G01H 11/08; H02N 2/186; H02N 2/188; H02K 7/1876; H02K 7/1892; H02K 35/02
  See application file for complete search history.

(56) References Cited

U.S. PATENT DOCUMENTS

| | | | |
|---|---|---|---|
| 7,259,492 B2 | 8/2007 | Yang | |
| 7,569,952 B1 | 8/2009 | Bono et al. | |
| 8,519,554 B2 | 8/2013 | Kaplan | |
| 8,604,676 B1 | 12/2013 | Finkel et al. | |
| 8,853,870 B2* | 10/2014 | Moss | F03G 7/08 290/1 R |
| 9,048,762 B1 | 6/2015 | Finkel et al. | |
| 9,484,795 B2* | 11/2016 | Moss | H10N 30/30 |
| 9,490,728 B1 | 11/2016 | Finkel et al. | |
| 2004/0095217 A1* | 5/2004 | Loopstra | G03F 7/70758 335/179 |
| 2004/0135468 A1* | 7/2004 | De Weerdt | G03F 7/70758 310/311 |
| 2009/0085359 A1 | 4/2009 | Mabuchi et al. | |
| 2009/0167033 A1 | 7/2009 | Rapoport | |
| 2010/0187835 A1 | 7/2010 | Hohlfeld et al. | |
| 2011/0187207 A1 | 8/2011 | Arnold et al. | |
| 2011/0285146 A1 | 11/2011 | Kozinsky et al. | |
| 2012/0280516 A1 | 11/2012 | Moss | |
| 2013/0342032 A1* | 12/2013 | Laurent | H02K 35/04 310/306 |
| 2014/0001889 A1 | 1/2014 | Hong | |
| 2015/0035409 A1* | 2/2015 | Procopio | H02N 2/188 310/319 |
| 2015/0358739 A1* | 12/2015 | Sipp | H04R 1/283 381/111 |
| 2016/0211439 A1* | 7/2016 | Najafi | H02N 2/188 |
| 2021/0184602 A1* | 6/2021 | Lee | F03G 7/08 |
| 2024/0248012 A1* | 7/2024 | Taft | G01N 29/07 |

FOREIGN PATENT DOCUMENTS

| | | |
|---|---|---|
| EP | 1424767 | 6/2004 |
| EP | 2031896 B1 | 1/2012 |
| JP | 2004186687 A | 7/2004 |
| JP | 2012115541 | 6/2012 |
| JP | 2012217039 A | 11/2012 |
| JP | 2014127794 A | 7/2014 |
| RU | 2425438 C1 | 7/2011 |
| SU | 1254315 A2 | 8/1986 |
| SU | 1394067 A2 | 5/1988 |
| WO | 2004015790 | 2/2004 |
| WO | 2010151738 A2 | 12/2010 |
| WO | 2012054994 A2 | 5/2012 |

OTHER PUBLICATIONS

O'Donnell et al., "Scaling effects for electromagnetic vibrational power generators," DTIP of MEMS & MOEMS, Apr. 26-28, 2006, 7 pages.
Pan et al., "Fabrication and analysis of a magnetic self-power microgenerator," Journal of Magnetism and Magnetic Materials, vol. 304, Mar. 3, 2006, 3 pages.
Comsol, "Piezoelectric Tonpilz Transducer," Application ID: 11478, 52 pages.
Corning, "MACOR Machinable Glass Ceramic," Corning Specialty Glass, URL:[https://www.corning.com/au/en/products/advanced-optics/product-materials/specialty-glass-and-glass-ceramics/glass-ceramics/macor.html], retrieved Mar. 22, 2024, 2 pages.
Zhang et al., "The Study of 32-Mode Single Crystal Longitudinal Transducer," IEEE/OES China Ocean Acoustics Symposium, Jan. 9-11, 2016, 4 pages.
Vanderwater et al, "Modelling of a Bi-axial Vibration Energy Harvester," Air Vehicles Division, Defence Science and Technology Organisation, May 2013, retrieved from the Internet on May 15, 2018, 48 pages.
Moss et al. "Wideband vibro-impacting vibration energy harvesting using magnetoelectric transduction," Journal of Intelligent Material Systems and Structures, May 6, 2012, 12 pages.
Moss et al. "A bi-axial magnetoelectric vibration energy harvester," Sensors and Actuators A: Physical vol. 175, Dec. 20, 2011, 4 pages.
Moss et al. "A broadband vibro-impacting power harvester with symmetrical piezoelectric bimorph-stops," Smart Materials and Structures vol. 20, Mar. 15, 2011, 12 pages.
Moon et al., "The fractal dimension of the two-well potential strange attraction," Physica D: Nonlinear phenomena vol. 17, Issue 1, Aug. 1985, 10 pages.
Moon et al., "A magnoelastic strange attractor," Journal of Sound and Vibration, vol. 65, No. 2, Apr. 5, 1979, 22 pages.
Dai et al., "Energy harvesting from mechanical vibrations using multiple magnetostrictive/piezoelectric composite transducers," Sensors and Actuators A: Physical, vol. 166, Jan. 4, 2011, 9 pages.
Dai et al., "Modeling, characterization and fabrication of vibration energy harvester using terfenol-D/PZT/terfenol-D composite transducer," Sensors and Actuators A: Physical, vol. 156, Oct. 24, 2009, 9 pages.
Barry et al. "Effect of Gap-Size Δ on the Output Power of a Vibro-Impacting Power Harvester," Defence Science and Technology Organisation, Air Vehicles Division, Australia, 1 page.
Zorlu et al., "A vibration-based electromagnetic energy harvester using mechanical frequency up-conversion method," IEEE Sensors Journal, 11, No. 2, Feb. 2011, 8 pages.
Zhu et al., "Design and experimental characterization of a tunable vibration-based electromagnetic micro-generator," Sensors and Actuators, A: Physical, vol. 158, Jan. 13, 2010, 10 pages.
Yuen et al., "An AA-sized vibration based microgenerator for wireless sensors," IEEE Pervasive Computing, 6(1), 64-72 Jan.-Mar. 2007, 9 pages.
Xing et al., "High power density vibration energy harvester with high permeability magnetic material," Journal of Applied Physics, vol. 109, Mar. 25, 2011, 3 pages.
Xing et al., "Wideband vibration energy harvester with high permeability magnetic material," Applied Physics Letters, vol. 95, Sep. 19, 2009, 3 pages.
Williams et al., "Development of an electromagnetic microgenerator," IEE Proc.-Circuits Devces Systems, 148(6), 337-342 (2001), 6 pages.
Wang et al., "A micro electromagnetic low level vibration energy harvester based on MEMS technology," Microsystem Technologies, 15 (941-951), Apr. 12, 2009, 11 pages.
Vandewater et al., "Optimal coil transducer geometry for an electromagnetic nonlinear vibration energy harvester", Key Engineering Materials vol. 558, 2013, 12 pages.
Vandewater et al., "Non-linear dynamics of a vibration energy harvester by means of the homotopy analysis method", Journal of Intelligent Material Systems and Structures, published online Nov. 7, 2013, 10 pages.

(56) References Cited

OTHER PUBLICATIONS

Torah et al., "Self-powered autonomous wireless sensor node using vibration energy harvesting," Measurement Science and Technology, vol. 19, Oct. 24, 2008, 8 pages.
Stephen, "On energy harvesting from ambient vibration," Journal of Sound and Vibration, 293, 409-425, Dec. 15, 2006, 17 pages.
Doughney et al., "Relaxor Ferroelectric Transduction for High Frequency Vibration Energy Harvesting," Smart Materials and Structures, vol. 28, Defence Science and Technology Group, Australia, May 1, 2019, 16 pages.
International Searching Authority, "International Search Report," issued in connection with International Patent Application No. PCT/AU2021/050199, mailed on May 6, 2021, 6 pages.
International Searching Authority, "Written Opinion," issued in connection with International Patent Application No. PCT/AU2021/050199, mailed on May 6, 2021, 6 pages.
Magnetics & Materials LLC, "Permeance Coefficient (Pc) Calculation for Axial Cylinders," URL:[https://www.magmatllc.com/calc_pc_cax.html], retrieved Mar. 22, 2024, 1 page.
Park et al., "Micro-fabricated electromagnetic power generator to scavenge low ambient vibration," IEEE Transactions on Magnetics, vol. 46, Issue 6, Jun. 2010, 6 pages.
Liu et al., "Real-time observation of stress-induced domain evolution in a [011] PIN-PMN-PT relaxor ferroelectric single crystal," Acta Materialia, Jun. 2019, 9 pages.
Vien et al., "Measured Lamb wave radiation patterns from [011] Mn-PMN-PZT relaxor ferroelectric disks on an isotropic plate," Applied Physics Letters, vol. 113, Issue 12, Sep. 18, 2018, 6 pages.
Sato et al., "Simple and approximate expressions of demagnetizing factors of uniformly magnetized rectangular rod and cylinder," Journal of Applied Physics, vol. 66, Issue 2, Jul. 15, 1989, 4 pages.
Sari et al., "An electromagnetic micro power generator for wideband environmental vibrations," Sensors and Actuators A: Physical, vols. 145-146, Issues 1-2, Nov. 26, 2007, 9 pages.
Sasaki et al., "Vibration-based automatic power-generation system," Microsystem Technologies, vol. 11, May 11, 2005, 5 pages.
Serre et al., "Design and implementation of mechanical resonators for optimized inertial electromagnetic microgenerators," Proceedings of SPIE, vol. 6589, 2007, 8 pages.
Hillger, "Lamb-Waves for Air-coupled Ultrasonic Testing with One-sided Access," 8th European Workshop On Structural Health Monitoring (EWSHM 2016), Jul. 5-8, 2016, 8 pages.
Buckley, "Air Coupled Ultrasound—A Millennial Review," 15th World Conference On Non-Destructive Testing, 2000, 6 pages.
Tsoi et al., "Non-destructive Evaluation of Aircraft Structural Components and Composite Materials at DSTO Using Sonic Thermography," Australian Government Department of Defence, Defence Science and Technology Organisation, Feb. 2011, 70 pages.
Sherlock, "Relaxor-PT Single Crystals for Broad Bandwidth, High Power SONAR Projectors," The Pennsylvania State University, Dec. 2010, 165 pages.
Zhang et al., "Advantages and Challenges of Relaxor-PBTiO3 ferroelectric Crystals for Electroacoustic Transducers—A Review," Progress in Smart Materials Science, vol. 68, Mar. 1, 2015, 124 pages.
Lurton, "An Introduction to Underwater Acoustics Principles and Applications," Springer Praxis Books, 2002, 63 pages.
IP Australia, "Examination Report No. 1," issued in connection with Australian Patent Application No. 2012202647, dated Feb. 12, 2014, 5 pages.
Şahin, "Barrel-Stave Flextensional Transducer Design," Bilkent University, Mar. 2009, 119 pages.
Jones et al., "Barrel-Stave Flextensional Transducers for SONAR Applications," 15th Biennial Conference on Mechanical Vibration and Noise, Sep. 17-20, 1995, 7 pages.
Serre et al., "Vibrational energy scavenging with Si technology electromagnetic inertial microgenerators," Microsystem Technologies, vol. 13, Feb. 13, 2007, 7 pages.
Thompson et al., "Performance of Tonpilz Transducers With Segmented Piezoelectric Stacks Using Materials With High Electromechanical Coupling Coefficient," The Journal of the Acoustical Society of America, vol. 135, Issue 1, Jan. 1, 2014, 10 pages.
Inoue et al., "A Design Method for Tonpilz Piezoelectric Underwater Transducer," Japanese Journal of Applied Physics, vol. 29, Issue 56, Proceedings of the 10th Symposium on Ultrasonic Electronics, 1989, 4 pages.
Kurt et al., "Vibro-Acoustic Design, Manufacturing and Characterization of a Tonpilz-type Transducer," Applied Acoustics, vol. 150, Jul. 2019, 9 pages.
Butler et al., "Transducers and Arrays for Underwater Sound," Modern Acoustics and Signal Processing, Springer International, 2nd Edition, Mar. 2016, 735 pages.
Shearwood et al., "Development of an electromagnetic microgenerator," Electronics Letters, vol. 33, No. 22, Oct. 12, 1997, 2 pages.
Soliman et al., "A wideband vibration-based energy harvester," Journal of Micromechanics and Microengineering, vol. 18, Oct. 7, 2008, 12 pages.
Spreemann et al., "Novel non-resonant vibration transducer for energy harvesting," PowerMEMS, The Fifth Workshop on Micro and Nanotechnology for Power Generation and energy Conversion Applications, Nov. 28-30, 2005, 3 pages.
Griffith, "The Phenomena of Rupture and Flow in Solids," Philosophical Transactions of the Royal Society of London, published Oct. 21, 1920, 36 pages.
Amirtharajah et al., "Self-powered Signal Processing Using Vibration-Based Power Generation," IEEE Journal of Solid-State Circuits, vol. 33, Issue 5, May 1998, 9 pages.
Ayala-Garcia et al., "A tunable kinetic energy harvester with dynamic over range protection," Smart Materials and Structures, vol. 19, Issue 11, Sep. 21, 2010, 11 pages.
Beeby et al., "A micro electromagnetic generator for vibration energy harvesting," Journal of Micromechanics and Microengineering, vol. 17, Jun. 5, 2007, 9 pages.
Beeby et al., "Experimental comparison of macro and micro scale electromagnetic vibration powered generators," Microsystem Technologies, vol. 13, Jan. 16, 2007, 7 pages.
Bowers et al., "Spherical, rolling magnet generators for passive energy harvesting from human motion," Journal of Micromechanics and Microengineering, vol. 19, Issue 9, Aug. 26, 2009, 7 pages.
Cao et al., "Electromagnetic energy harvesting circuit with feedforward and feedback DC-DC PWM boost converter for vibration power generator system," IEEE Transaction on Power Electronics, vol. 22, Issue 2, Mar. 2007, 7 pages.
Cepnik et al., "Effective optimization of electromagnetic harvesters through direct computation of the electromagnetic coupling," Sensors and Actuators, vol. 167, Mar. 1, 2011, 6 pages.
Challa et al., "A vibration energy harvesting device with bidirectional resonance frequency turnability," Smart Materials and Structures, vol. 17, Issue 1, Jan. 8, 2008, 11 pages.
Ching et al., "A laser-micromachined multi-modal resonating power transducer for wireless sensing systems," Sensors and Actuators A: Physical, vols. 97-98, 2002, 6 pages.
El-Hami et al., "Design and fabrication of a new vibration-based electromechanical power generator," Sensors and Actuators A: Physical, vol. 92, Issues 1-3, 2001, 21 pages.
Galchev et al., "A parametric frequency increased power generator for scavenging low frequency ambient vibrations," Procedia Chemistry, vol. 1, Issue 1, 2009, 4 pages.
Glynne-Jones et al., "An electromagnetic, vibration-powered generator for intelligent sensor systems," Sensors and Actuators A: Physical, vol. 110, Issues 1-3, 2004, 6 pages.
Hoffman et al., "Flexible polyimide film technology for vibration energy harvesting," PowerMEMS, Dec. 1-4, 2009, 4 pages.
Huang et al., "A silicon MEMS micro power generator for wearable micro devices," Journal of the Chinese Institute of Engineers, vol. 30, Issue 1, 2007, 8 pages.
Jang et al., "A tunable rotational energy harvester for low frequency vibration," Applied Physics Letters, vol. 99, Issue 13, Sep. 27, 2011, 3 pages.
Kazmierski et al., "Energy Harvesting Systems," Principles, Modeling and Applications, Springer, 2011, 169 pages.

(56) References Cited

OTHER PUBLICATIONS

Khaligh et al., "Kinetic Energy Harvesting using Piezoelectric and Electromagnetic Technologies—State of the Art," IEEE Transactions on Industrial Electronics, vol. 57, Issue 3, Mar. 2010, 11 pages.
Koukharenko et al., "Microelectromechanical systems vibration powered electromagnetic generator for wireless sensor applications," Microsystem Technology, vol. 12, Apr. 25, 2006, 7 pages.
Kulah et al., "An electromagnetic micro power generator for low-frequency environmental vibrations," Proceedings of the 17th IEEE International Conference on Micro Electro Mechanical Systems, 2004, 4 pages.
Kulkarni et al., "Design, fabrication and test of micro-scale vibration-based electromagnetic generator," Sensors and Actuators A: Physical, vols. 145-146, Issues 1-2, Sep. 29, 2007, 7 pages.
Kulkarni et al., "Fabrication and test of integrated micro-scale vibration based electromagnetic generator," 4th International Conference on Solid-State Sensors, Actuators and Microsystems, Transducers and Eurosensors, Jun. 10-14, 2007, 4 pages.
Mann et al., "Investigations of a nonlinear energy harvester with a bistable potential well," Journal of Sound and Vibration, vol. 329, Dec. 21, 2009, 12 pages.
International Searching Authority, "International Search Report," issued in connection with International Application No. PCT/AU2021/050198, mailed on May 6, 2021, 7 pages.
International Searching Authority, "Written Opinion," issued in connection with International Application No. PCT/AU2021/050198, mailed on May 6, 2021, 6 pages.
Eclipse Magnetics, "Sintered Neodymium Iron Boron (NdFeB) Magnets," Eclipse Magnetics Ltd., 32 pages.
Vokoun et al., "Magnetostatic interactions and forces between cylindrical permanent magnets," Journal of magnetism and Magnetic Materials, vol. 321, Jul. 17, 2009, 6 pages.
Dong et al., "Energy harvesting using the FER-FEO phase transformation in [011] cut single crystal PIN-PMN-PT," Journal of Intelligent Material Systems and Structures, Mar. 10, 2014, 15 pages.
Butler et al., "A 2.5 Magnetostrictive Tonpilz Sonar Transducer Design," Proceedings of SPIE vol. 4699, Jul. 15, 2002, 12 pages.
Decarpigny et al., "The Design of Low-Frequency Underwater Acoustic Projectors: Present Status and Future Trends," IEEE Journal of Oceanic Engineering, vol. 16, No. 1, Jan. 1, 1999, 16 pages.
Royster, "The Flextensional Concept: A New Approach to the Design of Underwater Acoustic Transducers," Applied Acoustics (3), Sep. 1, 1969, 10 pages.
Leach, Jr., "Controlled-Source Analogous Circuits and SPICE Models for Piezoelectric Transducers," IEEE Transactions on Ultrasonics, Ferroelectrics, and Frequency Control, vol. 41, No. 1, Jan. 1994, 7 pages.
Amin et al., "Mechanical and Thermal Transitions in Morphotropic PZN-PT and PMN-PT Single Crystals and Their Implications for Sound Projectors," IEEE Transactions on Ultrasonics, Ferroelectrics, and Frequency Control, vol. 54, No. 6, Jun. 2007, 6 pages.
Sherman, "Analysis of Acoustic Interactions in Transducer Arrays," IEEE Transactions on Sonics and Ultrasonics, vol. SU-13, No. 1, Mar. 1966, 7 pages.
Spreemann et al., "Non-resonant vibration conversion," Journal of Micromechanics and Microengineering, vol. 16, Aug. 9, 2006, 6 pages.
Arnold, "Review of Microscale Magnetic Power Generation," IEEE Transactions on Magnetics, vol. 43, No. 11, Nov. 2007, 12 pages.
Erturk et al., "Broadband piezoelectric power generation on high-energy orbits of the bistable Duffing oscillator with electromechanical coupling," Journal of Sound and Vibration, vol. 330, Dec. 13, 2010, 15 pages.
Fiebig, "Revival of the magnetoelectric effect," Journal of Physics D: Applied Physics, vol. 38, Apr. 1, 2005, 31 pages.
Ma et al., "Recent Progress in Multiferroic Magnetoelectric Composites: from Bulk to Thin Films," Advanced Materials 23, 2011, 26 pages.
Moss et al., "A low profile vibro-impacting energy harvester with symmetrical stops," Applied Physics Letters, No. 97, Dec. 6, 2010, 4 pages.
Moss et al., "Vibro-impacting power harvester," Proceedings of SPIE vol. 7643, 2010, 12 pages.
Moss et al., "Broad-band Vibro-Impacting Energy Harvester," Materials Science Forum vols. 654-656, Jun. 30, 2010, 4 pages.
Ryu et al., "Magnetoelectric Properties in Piezoelectric and Magnetostrictive Laminate Composites," The Japan Society of Applied Physics, vol. 40, May 17, 2001, 4 pages.
Yang et al., "Design, Analysis of Broadband Vibration Energy Harvester Using Magnetolectric Transducer," PowerMEMS, 2010, 4 pages.
Okawara et al., Electromechanical Properties of High-Coupling $(1-x)Pb(Zn1/3Nb2/3)O3(x)PbTiO3$ Single Crystals for Sound Projectors, IEEE Transactions on Ultrasonics, Ferroelectrics, and Frequency Control, vol. 57, No. 7, Jul. 2010, 8 pages.
United States Patent and Trademark Office, Non-Final Office Action, issued in connection with U.S. Appl. No. 13/464,701, dated Feb. 21, 2014, 11 pages.
Japan Patent Office, "Notice of Reasons for Refusal," issued in connection with Japanese Patent Application No. 2022533224, dated Jan. 21, 2025, 6 pages.

* cited by examiner

VIBRATION ENERGY PROJECTION DEVICES AND SYSTEMS

RELATED APPLICATION

This patent arises from the U.S. national stage of International Patent Application Serial No. PCT/AU2021/050198, having an international filing date of Mar. 5, 2021, which is hereby incorporated by reference in its entirety. Further, this patent claims priority to Australian Patent Application No. 2020900680, which was filed on Mar. 5, 2020, and is hereby incorporated herein by reference in its entirety

TECHNICAL FIELD

Embodiments relate generally to vibration energy transduction devices and systems, and in particular to vibration energy projection or detection devices and systems. In particular, embodiments relate generally to a novel arrangement of magnets and a piezoelectric transducer, where the arrangement is configured to keep the piezoelectric transducer in compression.

BACKGROUND

Recent advances in material technology have resulted in new piezoelectric crystal materials becoming available. Examples of such materials include relaxor ferroelectric single crystal (RFSC) materials. Such materials can be used in vibration energy harvesting and ultrasonic projection devices, but such materials do not last long if placed under tension due to internal flaws creating stress concentrations and/or crack propagation.

It is desired to address or ameliorate one or more shortcomings or disadvantages associated with prior vibration energy transduction devices, or to at least provide a useful alternative thereto.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each of the appended claims.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

Some embodiments relate to an energy transduction apparatus, including:
a base;
a first magnet coupled to or comprising the base;
a piezoelectric transducer disposed adjacent the first magnet;
a magnet arrangement co-axial with the piezoelectric transducer, wherein the magnet arrangement is disposed on opposite sides of or at least partly around the piezoelectric transducer, or the piezoelectric transducer is disposed on opposite sides of or at least partly around the magnet arrangement, wherein the magnet arrangement is poled to have a first end of the magnet arrangement attracted to the first magnet;
a second magnet poled to be attracted to a second end of the magnet arrangement that is opposite the first end;
a vibratable mass coupled to or comprised by the second magnet;
electrical conductors electrically connected to the piezoelectric transducer to conduct current between the piezoelectric transducer and external circuitry; and
wherein the first magnet, the piezoelectric transducer, the magnet arrangement, and the second magnet are substantially coaxial;
wherein the first magnet, the second magnet and the magnet arrangement cooperate to keep the piezoelectric transducer in compression; and
wherein vibrational movement of the second magnet is directly related to compression of the piezoelectric transducer and current flow in the electrical conductors;
wherein the apparatus is configured to convert current in the electrical conductors into vibration of the vibratable mass in a frequency range of about 300 Hz to about 100 kHz to thereby act as an acoustic projector.

In various embodiments, the magnet arrangement and the second magnet are configured to exert between about 5 Newtons (N) and about 50 Newtons of substantially static compressive force to the piezoelectric transducer. In some embodiments, the static compressive force is between about 90 N and about 400 N. In some embodiments, the static compressive force is between about 50 N and about 500 N.

The magnet arrangement may be disposed at least partly around the piezoelectric transducer. The vibratable mass may comprise a resonant mass.

The piezoelectric transducer may include a relaxor ferroelectric single crystal (RFSC). The piezoelectric transducer may include a binary or ternary piezoelectric single crystal. The piezoelectric transducer may be a PMN-PT or PZN-PT crystal. The piezoelectric transducer may be a PIN-PMN-PT or PMN-PZT crystal. The piezoelectric transducer may be a Mn-PIN-PMN-PT crystal or a Mn-PMN-PZT crystal. The piezoelectric transducer may alternatively be or include a piezoceramic material (e.g. PZT) or a piezopolymer material (e.g. PVDF—polyvinylidene fluoride or polyvinylidene difluoride).

A piezoelectric crystal of the piezoelectric transducer may be poled [011] and arranged to operate in transverse extension (3-2) mode, with a 2 axis of the piezoelectric crystal being substantially coaxial with the first magnet, the magnet arrangement, the spacer, the second magnet and the vibratable mass.

The first magnet, the magnet arrangement and the second magnet may be rare earth magnets. The apparatus may further comprise an impedance matching layer and/or an acoustic lens disposed at an outer end of the second magnet.

The apparatus may include a first thin shim disposed between the first magnet and a first end of the piezoelectric transducer and a second thin shim disposed between the second magnet and an opposite second end of the piezoelectric transducer. The first thin shim and the second thin shim may be formed of a machinable glass ceramic material.

The piezoelectric transducer may include a spacer positioned between the first magnet and the second magnet. The spacer may be significantly more compressible than the magnet arrangement and the piezoelectric transducer. The spacer may define an aperture to receive the piezoelectric transducer therethrough. The spacer may have an axial thickness of between about 1 mm and about 3 mm when the vibratable mass is at rest. The spacer may have an axial thickness of between about 2.4 mm and about 2.8 mm when the vibratable mass is at rest.

The magnet arrangement may define a passage through which the piezoelectric transducer extends, and the magnet arrangement and the piezoelectric transducer may not contact each other in the passage. The magnet arrangement may be symmetrical about multiple axes. The magnet arrangement may comprise a unitary magnet body. The magnet arrangement may comprise multiple magnet bodies fixed in position relative to each other. An axial spacer may be disposed between two of the multiple magnet bodies. The apparatus may further include an alignment disc disposed between and coaxial with two of the multiple magnet bodies, the alignment disc defining an alignment aperture in a centre of the alignment disc to receive and axially align the piezoelectric transducer. The alignment disc may be formed of a magnetically inert material. The magnet arrangement may be substantially cylindrical.

The spacer may comprise a plurality of compressible ligaments arranged to separate the magnet arrangement and the second magnet, wherein an axial length of the piezoelectric transducer is substantially the same as a combined axial length of the spacer and the magnet arrangement.

In alternative embodiments, the apparatus may be configured to convert vibration energy of the vibratable mass into current in the electrical conductors and to thereby act as an energy harvesting apparatus.

Some embodiments relate to an aircraft or watercraft comprising the apparatus installed and/or mounted on or within the aircraft or watercraft so as to project vibration energy from a component, such as a mounting body, of the aircraft or watercraft. Some embodiments relate to a watercraft comprising the apparatus mounted on the watercraft to project vibration energy from the watercraft during use of the watercraft.

The magnet arrangement may be disposed concentrically with the piezoelectric transducer.

The piezoelectric transducer may at least partially surround the magnet arrangement. The piezoelectric transducer may comprise multiple stacked piezoelectric transducer elements. The magnet arrangement may comprise a cylindrical magnet that is one of:
    in contact with the first magnet or the second magnet but not both; and
    in contact with a thin bonding layer that bonds the cylindrical magnet to the first magnet or the second magnet.

The combination of the first magnet, the magnet arrangement and the second magnet may be configured to exert between about 50 Newtons and about 500 Newtons of substantially static compressive force to the piezoelectric transducer. In some embodiments, the static compressive force is between about 5 N and about 50 N.

The static compressive force and the movement of the piezoelectric transducer may be aligned in a same axial direction.

The apparatus may be configured to convert vibration energy of the second magnet into current in the electrical conductors and to thereby act as an energy harvesting apparatus.

The apparatus may be configured to convert current in the electrical conductors into vibration of the second magnet in a frequency range of about 300 Hz to about 100 kHz to thereby act as an acoustic projector.

Some embodiments relate to an energy transduction device, including:

a piezoelectric transducer;
electrical conductors electrically coupled to the piezoelectric transducer;
an axially aligned magnet assembly arranged to apply static compressive force to the piezoelectric transducer, the magnet assembly being coupled to a base at one end and having a free opposite end;
wherein the magnet assembly is coaxial with the piezoelectric transducer and at least part of the magnet assembly is concentric with the piezoelectric transducer;
wherein the magnet assembly defines a gap between axially adjacent parts of the magnet assembly, wherein the gap is dimensioned to be sufficiently small that the magnet assembly applies a high static compressive force to the piezoelectric transducer while being sufficiently large to allow for axial movement of the piezoelectric transducer without closing the gap.

In some embodiments, the static compressive force is between about 5 Newtons and about 50 Newtons. In alternative embodiments, the static compressive force is between about 50 N and about 500 N, optionally between about 90 N and about 400 N.

The gap may define an axial separation between axially adjacent parts of the magnet assembly of between about 0.2 mm and about 1.0 mm.

Some embodiments relate to an acoustic projection system, comprising multiple ones of the apparatus or the device described herein mounted to one or more mounting bodies to project vibration energy away from the one or more mounting bodies.

Some embodiments relate to an acoustic detection system, comprising multiple ones of the apparatus or the device described herein mounted to one or more mounting bodies and configured to detect vibration energy when the respective ones of the apparatus or device are not being used for acoustic projection.

In various embodiments of the acoustic projection or detection system, ones of the apparatus or device may be positioned at spaced locations on the one or more mounting bodies.

In various embodiments of the acoustic projection or detection system, multiple ones of the apparatus or device are arranged in an array or bank on the one or mounting bodies.

In various embodiments of the acoustic projection or detection system, multiple ones of the apparatus or device are arranged to face a same direction.

In various embodiments of the acoustic projection or detection system, multiple ones of the apparatus or device are arranged to face a different direction.

BRIEF DESCRIPTION OF DRAWINGS

Embodiments are described in further detail below, by way of example, with reference to the accompanying drawings, in which.

DETAILED DESCRIPTION

Embodiments relate generally to high frequency vibration energy transduction devices and systems. Embodiments include a vibratable mass as part of the device. In particular, embodiments relate generally to a novel arrangement of magnets and a piezoelectric transducer that is aimed at keeping the piezoelectric transducer in compression. For example, some embodiments may apply a static compressive force to the piezoelectric transducer in the range of about 5 Newtons (N) to about 50 Newtons or about 50 Newtons to about 500 Newtons.

Some vibration energy transduction embodiments are optimised for vibration energy harvesting by transducing vibration energy into electrical energy, while other embodiments are optimised for pressure wave generation by transducing electrical energy into (kinetic) vibration energy. Embodiments that are optimised for pressure wave generation by transducing electrical energy into (kinetic) vibration energy may be described as electro-acoustic transduction (or "acoustic projection") devices. Many of the same energy transduction principles and device design considerations apply to both forms of transduction.

Figure 1:
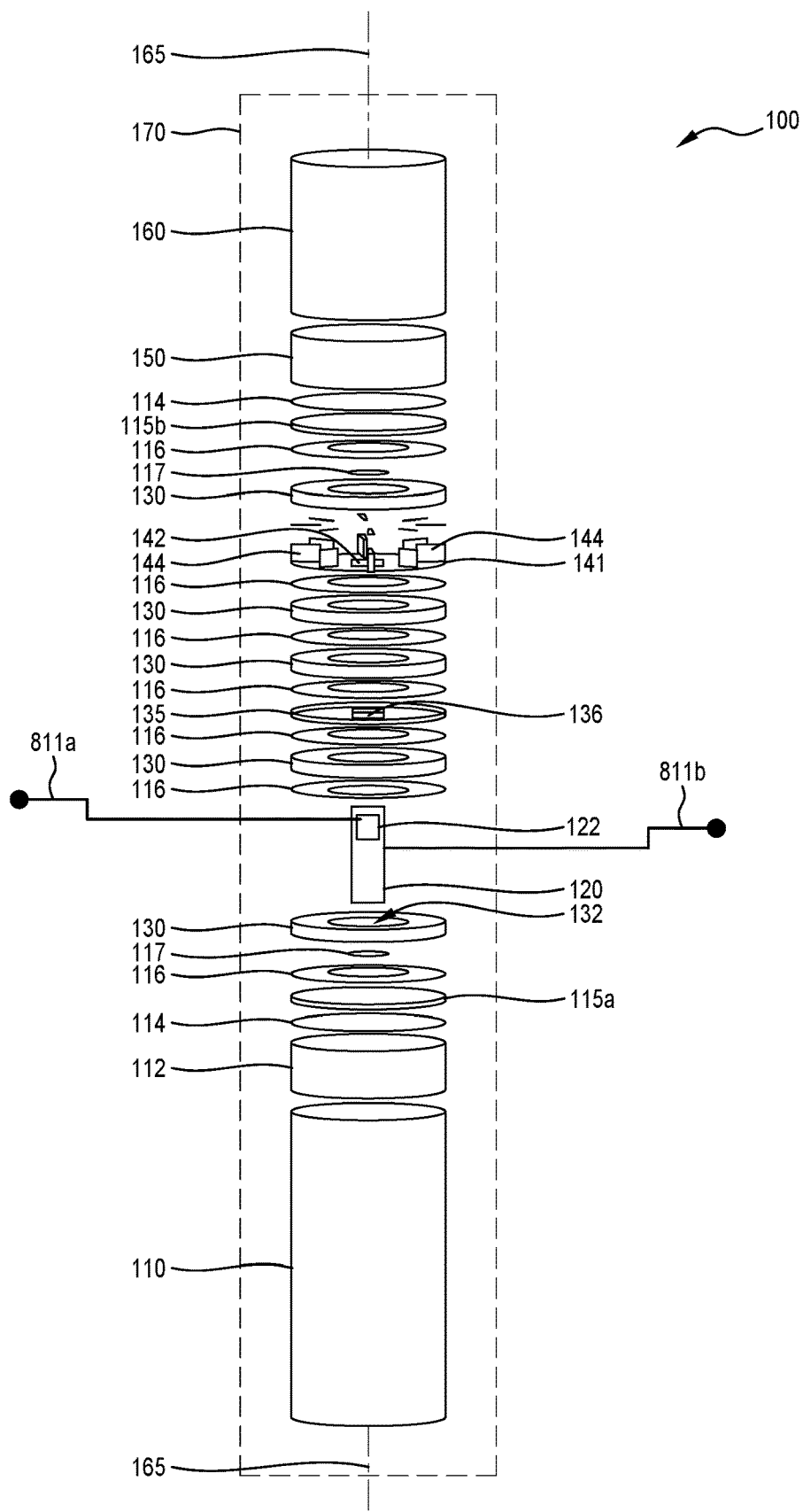
FIG. 1 is a schematic exploded perspective view of an energy harvesting device according to some embodiments.

Embodiments of vibration energy transduction devices and techniques that are optimised for vibration energy harvesting, but also suitable or modifiable for pressure wave generation, are described first, with reference to FIGS. 1 to 13. FIGS. 1 and 6 show in detail the arrangement of components of a vibration energy transducer optimised as a vibration energy harvesting device 100 according to some embodiments. FIG. 8 is a schematic cross-sectional illustration of a vibration energy harvesting device 800 having the same components and configuration as device 100 but with an alternative magnet arrangement. Embodiments of vibration energy harvesting device 100, 800 are generally arranged as an axial stack of coaxial components. This means that vibration that is only along an axis orthogonal to the axis of the energy harvesting device 100, 800 will negligibly or not at all excite the energy harvesting device 100, 800.

Figure 2:
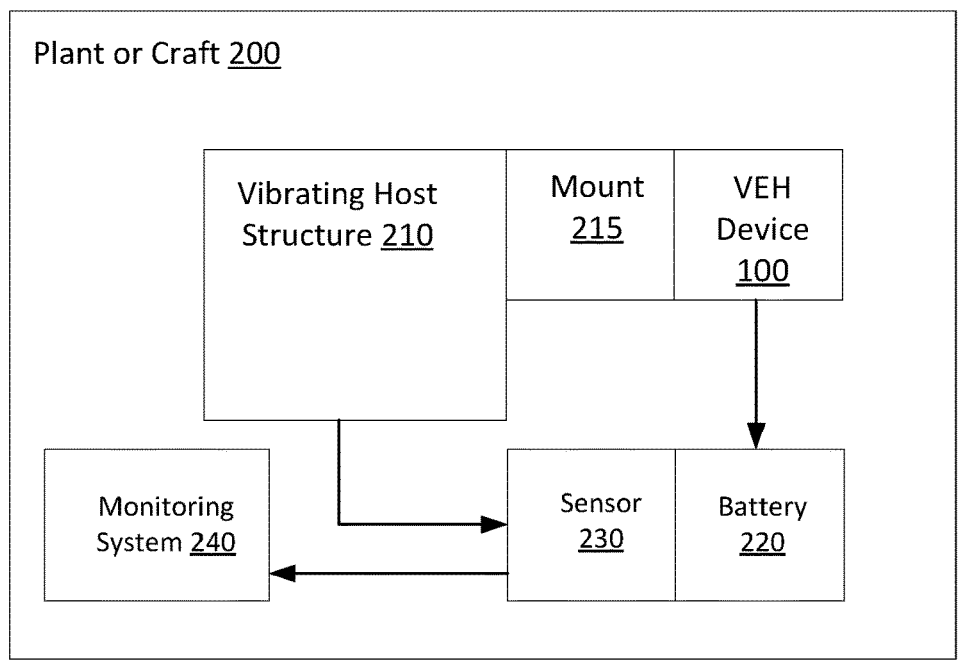
FIG. 2 is a schematic block diagram to illustrate an environment in which the vibration energy harvesting device can be used.

Vibration energy harvesting device 100 includes a base 110 that is anchored, coupled or otherwise connected to a vibrating host structure 210 via a mount 215 (see FIG. 2). As used herein, the term proximal indicates a direction toward the base 110 and the term distal indicates a direction away from the base 110. The vibrating host structure 210 may form part of a plant, equipment, vehicle or craft 200, for example. The craft 200 may include an aircraft, such as a helicopter, and the vibrating host structure 210 may include a gearbox, for example. In some embodiments, the base 110 may be omitted.

Some vibration energy harvesting applications benefit from matching the resonant frequency of the vibration energy harvesting device to that of the host structure 210. For other applications, it may be preferable that the resonant frequency of the vibration energy harvesting device is not matched to that of the host structure 210.

The vibration energy harvesting device 100 further includes a first magnet 112, a second magnet 150 and a magnet arrangement 130 in between the first and second magnets 112, 150. Also interposed between the first and second magnets 112, 150 are first and second shims 115a, 115b, a spacer 140, thin adhesive layers 114, 116, 117 and optionally an alignment disc 135. Also disposed in between the first magnet 112 and the second magnet 150 and at least partially surrounded by the magnet arrangement 130 is a piezoelectric transducer 120. These components of vibration energy harvesting device 100 are housed within a housing 170. The components of vibration energy harvesting device 100 are generally aligned along a single central axis 165. Axis 165 also corresponds to the proximal-distal direction as described herein. The magnet arrangement 130 defines a passage through which the piezoelectric transducer 120 extends, and the magnet arrangement 130 and the piezoelectric transducer 120 do not contact each other in the passage.

As used herein, the term magnet arrangement is intended to describe an arrangement involving one magnet or a combination of magnets that cooperate to achieve a described function. A magnet assembly as described herein is intended to describe a combination of multiple magnets that are physically and/or magnetically coupled together. A magnet arrangement may include a magnet assembly and a magnet assembly may include a magnet arrangement. However, specific embodiments described herein contemplate a magnet assembly that includes a magnet arrangement. For example, vibration energy harvesting devices 100, 800 include a magnet assembly that comprises magnetic head and tail masses and a magnet arrangement between the head and tail masses.

First and second magnets 112, 150 are preferably rare earth magnets and have strong attraction to magnetic materials. First magnet 112 is magnetically and/or mechanically coupled to base 110 on a proximal side of the first magnet 112. The first shim 115a is disposed on a distal side of the first magnet 112 and adhered thereto by an adhesive layer 114. The adhesive layers 114, 116 and 117 may include suitable epoxy adhesives, for example such as CB359. The first and second shims 115a, 115b may be machinable glass ceramic shims, for example. An example material for such a shim is a machinable glass ceramic material marketed under the Macor brand sold by Corning, Inc. Such shims may be suitable for their ability to allow a slight amount of surface deformation, thereby providing a slightly softer surface than most rare earth magnets and reducing the likelihood of fractures forming in the piezoelectric transducer (when formed as a crystal), for example due to the relatively high static compression forces applied to the piezoelectric transducer by the magnet assemblies described herein. However, in some embodiments, other analogously deformable materials may be used in place of shims 115a, 115b. Such analogous materials may be provided as a coating, layer, layer with a material compositional gradient, or thin sheet, disposed on a distal side of first magnet 112 or a proximal side of second magnet 150, for example. Such analogous materials may, for example, include a magnet-glass composite material with a higher glass concentration at a surface at which it is intended to contact the piezoelectric transducer 120.

Magnet arrangement 130 is positioned on a distal side of the first shim 115a and adhered thereto by adhesive layer 116. Thus, a proximal end of the magnet arrangement 130 is bonded to a distal face of the first shim 115a. The magnet arrangement 130 is generally cylindrical with an annular cross-section that defines an internal bore or hollow to receive the piezoelectric transducer 120 therein. The magnet arrangement 130 shown in FIG. 1 and FIG. 6 is made up of a plurality of axially stacked concentric magnetic annuli 131. Each of the annuli 131 may be adhered to adjacent distal and proximal axial structures by an adhesive layer 116. Each of the magnetic annuli 131 is preferably a rare earth magnet.

The purpose of the magnet arrangement 130 is to surround or at least partially surround the piezoelectric transducer 120 while exerting a strong magnetic attraction on axially adjacent components, in order to result in a compressive force being applied to opposite ends of the piezoelectric transducer 120. This strong magnetic attraction is due to the small separation between adjacent magnets and the choice of material for the magnets, such as are used in rare earth magnets. Because of the strong magnetic attraction forces between the components of the magnet arrangement 130 and/or first and second magnets 112, 150, the piezoelectric transducer 120 is kept under compression. For some piezoelectric materials, such as piezoceramics or piezoelectric crystals, which are a preferred form of piezo-electric transducer 120, allowing such materials to go into tension can rapidly result in structural breakdown of the material.

The presence of the spacer 140 within the axial stacks of magnets making up the magnet arrangement 130 and the first and second magnets 112, 150 aligned along axis 165 ensures that there is a small axial gap (occupied by the relatively compressible spacer) to allow for some relative axial movement of the tip mass 160 relative to the base 110 or at least the first magnet 112. This relative axial movement is permitted by the spacer 140 having an effective spring constant that is at least one or two orders of magnitude lower than the spring constant of the first and second magnets 112, 150 and magnet arrangement 130 and at least one or two orders of magnitude lower than the spring constant of the piezoelectric transducer 120. This allows the spacer 140 to experience small axial compression and extension when the host structure 210 (to which the base 110 is coupled) vibrates. Although the mount 215 that couples the vibration energy harvesting device 100 to the host structure 210 may have its own spring constant that factors into the transmission of vibration, it is generally intended that the spring constant of the mount 215 be one or two orders of magnitude higher than the spring constant of the spacer 140. Because of the inertia of the tip mass 160, vibrations transmitted through the base 110 tend to result in repeated compressions of the spacer 140 and simultaneous repeated compressions of the piezoelectric transducer 120.

Spacer 140 has a plate-like base 141 that defines a central aperture 142 sized to allow the piezoelectric transducer 120 to pass therethrough. Central aperture 142 may be slightly larger than 4 mm by 4 mm, for example. The spacer base 141 has a series of radially oriented ligaments 144 projecting upwardly therefrom. Each of the ligaments 144 has the same height so that the spacer 140 can keep an even distance from its proximal side to its distal side during vibration. The spacer 140 is formed of a material, such as a suitable plastic material, having a spring constant that is in the order of $1/10^{th}$ or less of the spring constant of the piezoelectric transducer 120. The gap maintained by the spacer 140 may be in the order of about 2.6 mm, for example, when the resonant tip mass 160 is at rest. The described arrangement allows around 10 microns of axial movement and compression of the piezoelectric transducer 120 during vibration.

The gap maintained by the presence of the spacer 140 is selected to allow compressive force due to magnetic attraction to be between about 50 Newtons and about 500 Newtons (N), for example. The spacer 140 may have an axial thickness of between about 1 mm and about 3 mm when the resonant tip mass 160 is at rest. In some embodiments, the spacer may have an axial thickness of between about 2.4 mm and about 2.8 mm when the resonant tip mass 160 is at rest.

In some embodiments, spacer 140 is positioned axially between two annuli 131 of the magnet arrangement 130. In other embodiments, the spacer 140 may be positioned distally of the magnet arrangement 130, so that the spacer 140 is positioned axially between the magnet arrangement 130 on its proximal side and the second magnet 150 (and second shim 115b) on its distal side. The second magnet 150 is magnetically or mechanically coupled to the resonant tip mass 160 on the distal side of the second magnet 150.

The resonant tip mass 160 is coupled only to the second magnet 150, or possibly an intervening structure, on the proximal side of the tip mass 160. The distal end of the resonant tip mass 160 is not fixed in position and is free to move axially. In some embodiments in which the vibration energy harvesting device 100 is positioned within a housing, that housing allows some freedom of movement, for example in the order of 2 to 5 mm, of lateral and/or axial movement before the resonant tip mass 160 will contact a wall of the housing. The resonant tip mass 160 may be formed primarily of tungsten carbide, for example.

The first and second shims 115a, 115b are selected to have a relatively low Young's Modulus so that they are soft enough to allow for the piezoelectric transducer 120 (when formed as a crystal) to not quite be perfectly axially aligned during manufacture or use of the vibration energy harvesting device 100, 800. Shims 115a, 115b may have a thickness of less than 1 mm, for example. Otherwise, the crystal structure of the piezoelectric transducer 120 can tend to fracture and/or wear too much during vibration under compression. For such reasons, shims having a similarly low Young's Modulus are also employed in other energy transducer device embodiments described herein, such as electroacoustic transduction devices, example of which include acoustic projectors 1400, 1500, 1600.

In some embodiments, a thin alignment disc 135 may be present in the middle of the axial stack of annuluses 131 of the magnet arrangement 130. The alignment disc 135 defines a central aperture 136 sized to be just larger than an outer perimeter of the piezoelectric transducer 120. The alignment disc 135 serves to assist the piezoelectric transducer 120 to be positioned in axial alignment with the magnet arrangement 130. The aperture 142 of spacer 140 also serves a similar alignment function to the alignment disc 135. Both the spacer 140 and the alignment disc 135 may be formed of a suitable polycarbonate material, for example.

Figure 3:
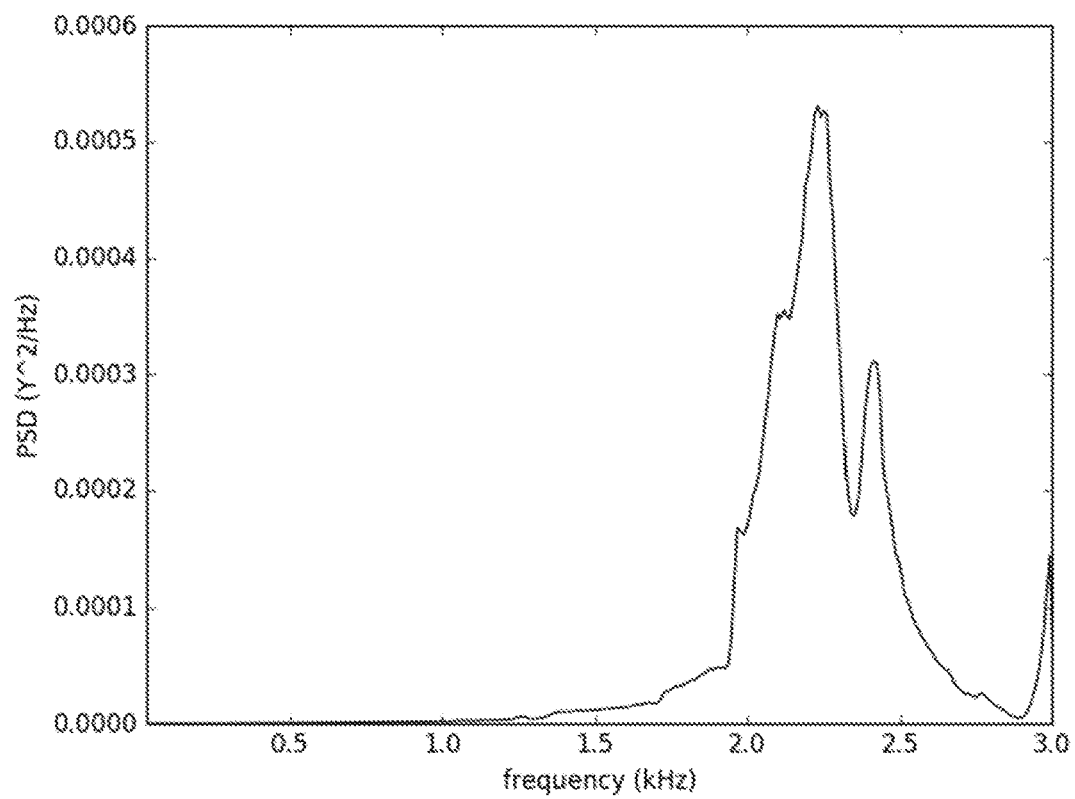
FIG. 3 is an example plot of frequencies at which the vibration energy harvesting device may be effective to generate electrical energy for some applications.

FIG. 3 is an example plot of power spectral density (PSD) versus frequency up to 3 kHz. FIG. 3 shows a power spectral density of acceleration measurements made at a top of the resonant mass 160 with the base 110 driven by a wide band vibration in the range of 30-3000 Hz. The peak shown in the region of 2000-2500 Hz is the resonant region, and shows that the response is relatively wideband, which in this case is over a band of around 500 Hz.

Figure 4:
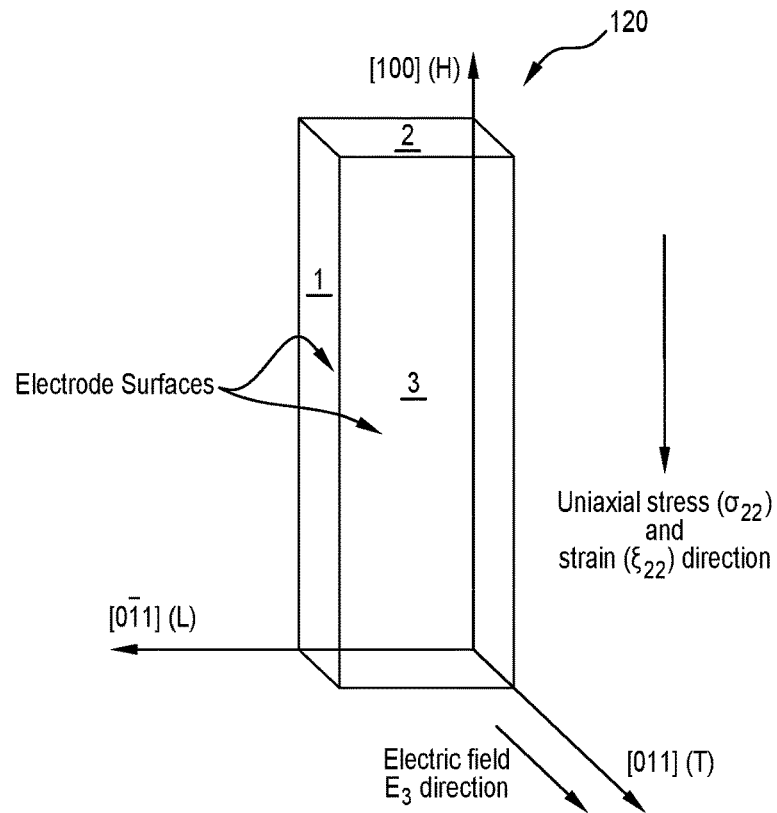
FIG. 4 is a schematic illustration of a piezoelectric transducer that can be used in the vibration energy harvesting device according to some embodiments.

FIG. 4 is an illustration of an example piezoelectric transducer 120 in the form of a piezoelectric crystal. Piezoelectric transducer 120 may be formed of other suitable materials, such as piezoceramics like lead zirconate titanate (PZT) or a piezopolymer material such as PVDF (polyvinylidene fluoride or polyvinylidene difluoride), for example. Certain piezoelectric crystals may be more effective as transduction devices than others. For example, piezoelectric crystals that are anisotropic with a mechanically soft axis may be preferred for allowing the vibration energy harvesting device 100, 800 to resonate at lower frequencies. Preferred materials for the piezoelectric transducer 120 include single crystal ferroelectric materials. Ferroelectric single crystals convert mechanical energy to electrical energy or vice versa. This makes them a candidate as the active material in energy harvesting devices. By utilizing the direct piezoelectric effect when mechanical is available from the environment, the mechanical can be converted to electric charge polarization in relaxor ferroelectric single crystal material and useful amounts of energy can be obtained.

A current promising class of materials for energy harvesting is relaxor-ferroelectric single crystals (RFSC). These materials are single crystals of ferroelectric materials (for example, lead zinc niobate-lead titanate, known as PZN-PT). These materials have been shown to deliver a relatively high output Voltage at greater efficiency when the crystal is subjected to stress. In some ferroelectric crystal material compositions, for example certain compositions of ternary lead indium niobate-lead magnesium niobate-lead titanate (PIN-PMN-PT), the crystal material undergoes a phase transformation when subjected to a critical amount of stress from an external source.

Relaxor single crystals display both a linear piezoelectric effect and a non-linear electromechanically coupled phase transition. The linear piezoelectric effect in relaxor single crystals has been observed to be approximately a factor of six times that of the ceramic lead zirconate titanate (PZT). Reversible stress- and temperature-induced phase transformations are associated with spontaneous charge generation in the relaxor single crystals. These phase transformations can provide more than an order of magnitude increase in energy density per cycle for mechanical energy harvesting. Utilizing this phase transformation behavior allows a stress-biased energy harvester to take maximum advantage of the phase transformation in the relaxor single crystal material.

Lead zirconate titanate ($Pb[Zr_xTi_{1-x}]O_3$, or PZT) materials typically exhibit a piezoelectric charge constant, d, in the range of 150-500 pC/N and an electromechanical coupling factor, k, of ~0.3 to 0.7. RFSC materials can exhibit significantly larger charge constant d and coupling factor k parameters. For example, first generation RFSC materials, $Pb(Zn_{1/3}Nb_{2/3})O_3$ (PZM-PT) and $Pb(Mg_{1/3}Nb_{2/3})O_3$ (PMN-PT), have piezoelectric charge constants that can be an order of magnitude greater than that of PZT, with an electromechanical coupling factor >0.9. These improved coefficients are present in relaxor ferroelectric compositions that are close to the morphotropic phase boundary (MPB). The first generation materials are not without their drawbacks. For example, the coercive field of PMN-PT is small ($E_C$~1.8 kV $cm^{-1}$) compared with that of PZT ($E_C$~8-15 kV $cm^{-1}$). The rhombohedral—tetragonal phase transition temperature PMN-PT is low ($T_{RT}$~85° C.), which means such materials may be incompatible with applications that experience elevated temperatures. Second generation RFSC materials, such as $Pb(In_{1/2}Nb_{1/2})O_3$—$Pb(Mg_{1/3}Nb_{2/3})O_3$—$PbTiO_3$ (or PIN-PMN-PT) have shown promise for use in energy harvester devices due to material properties such as a relatively high transition temperature of ($T_{RT}$~120° C.-140° C.) and around three times the coercive field ($E_C$~5.5 kV/cm) of first generation PMNPT single crystals. They also have piezoelectric charge constants that can be more than an order of magnitude higher than for PZT (e.g. d~1000-5000 pC/N).

More recently, it has been reported that the power density of third generation manganese modified $Pb(Mg_{1/3}Nb_{2/3})O_3$—$Pb(Zr,Ti)O_3$ (Mn-PMN-PZT) [011] poled single crystals is over 5 times higher than that of PZT4 ceramic. Third generation relaxor ferroelectric single crystals have shown improved fracture toughness and coercive field and also higher Curie and phase transition temperatures.

An additional benefit of RFSC materials for energy harvesting is their anisotropic material parameters, with electromechanical compliances s and charge constants d that can vary significantly with crystal direction. The $d_{32}$ transverse extension mode (or '3-2 mode') is particularly useful for energy harvesting applications. When used with a [011] poled RFSC, the '3-2 mode' permits the design of a harvester to exploit: (i) the large $d_{32}$ charge constant for improved electromechanical transduction compared with PZT; (ii) the large coupling factor k~0.9 also for improved transduction efficiency; and (iii) the mechanically soft axis '2' axis of [011] PIN-PMN-PT. The '2' axis of [011] PIN-PMN-PT has a compliance significantly greater than its '1' axis and also much greater than that of PZT, permitting the harvester's resonant frequency to be 2 to 3 times lower for an identically sized transducer element. In addition to these three advantages of '3-2 mode' transduction, there is evidence that [011] poled RFSC materials are more resistant to large-cycle induced degradation than [100] poled materials. These benefits mean that [011] poled PIN-PMN-PT single crystals, in '3-2 mode', can be suitable for use as a piezoelectric transducer in a vibration energy harvester.

Figure 5:
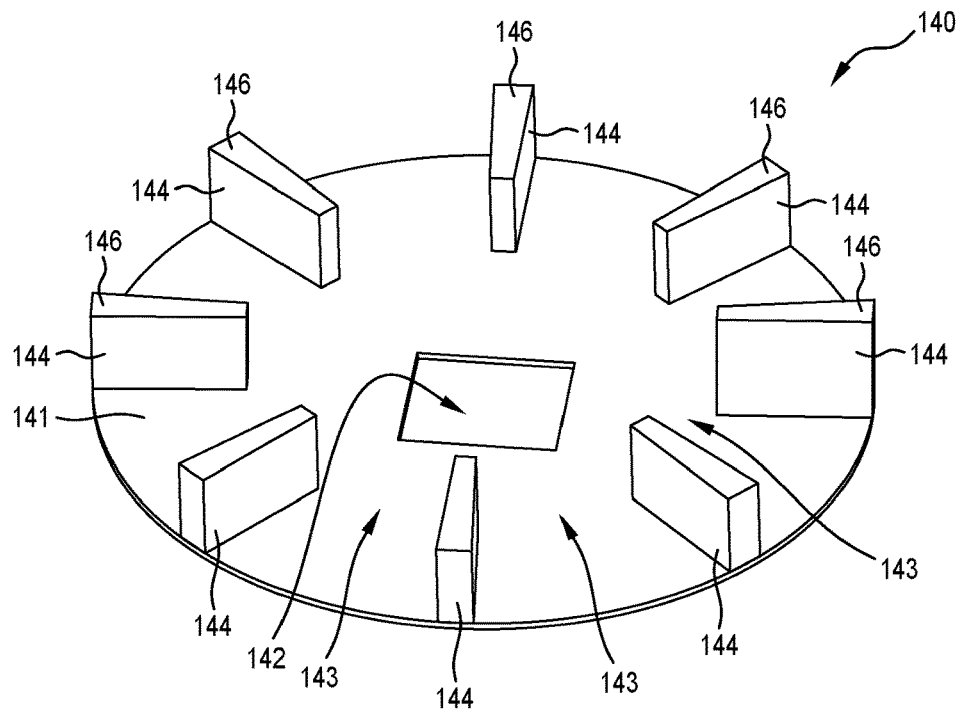
FIG. 5 is a perspective view of a spacer used in the vibration energy harvesting device according to some embodiments.
Figure 6:
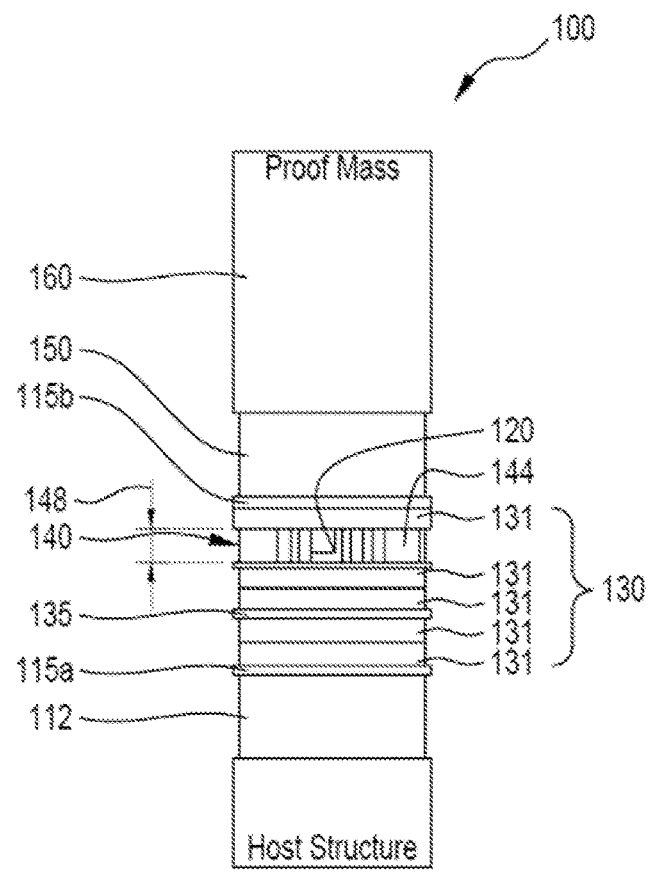
FIG. 6 is a side view of the vibration energy harvesting device according to some embodiments, where the magnet arrangement is shown having one example configuration.

FIG. 5 is a perspective view of the spacer 140 according to some embodiments. Although various configurations can be selected to achieve similar functions, the embodiments of spacer 140 shown have the effect of providing a compressible gap between axially adjacent magnetic components in the axial stack to thereby allow varying compression of the piezoelectric transducer 120 (positioned and aligned with an aperture 142) in response to vibrations experienced by the vibration energy harvesting device 100. Upper faces 146 of the ligaments 144 are made to be generally coplanar and may be adhered to the proximal surface of an annulus 131 or the second shim 115b, for example. Advantageously, the spaced radially directed array of ligaments 144 around the distal surface of the spacer base 141 allows electrical conductors to pass through spaces 143 between the ligaments 144, so that those conductors (e.g. 811a, 811b, FIG. 8) can be coupled to opposite conductive faces of the piezoelectric transducer 120. The piezoelectric transducer 120 may have conductive epoxy 122 on opposite faces thereof to readily enable conductors 811a, 811b to be electrically coupled to the piezoelectric transducer 120.

The ligaments 144 are formed so that their combined mechanical stiffness is much less than the piezoelectric transducer 120 so as to not interfere with the main resonance of the harvesting device 100, 800, which is ostensibly determined by the effective spring constant of the piezoelectric transducer 120 and the size of the resonant tip mass 160. The spacer 140 should have an effective mechanical stiffness less than ten times that of the piezoelectric transducer 120 so that any secondary resonances due to the spacer/resonant-mass interactions will be well away from the main frequency of interest for the energy harvesting device 100, 800. In addition, an approximate 10:1 ratio of transducer-to-spacer stiffness will ensure that the magnetic compressive force acts mainly through the piezoelectric transducer 120, maximizing the magnetic compression on the piezoelectric transducer 120 and minimising the possibility that it will go into tension during resonant motion.

The spacer 140 may be formed of a magnetically passive material, such as aluminium, polycarbonate, or similar materials, for example. Some embodiments may employ a spacer 140 that comprises ferromagnetic material, provided that such material has a suitably low spring constant and does not have the effect of reducing magnetic attraction between magnetic components on adjacent opposite sides of the spacer 140. The spacer 140 needs to be durable under dynamic loading to ensure a long operational life for the harvesting device 100, 800. In addition, the mechanical and material characteristics of the spacer 140 should not vary greatly at elevated temperatures. The spacer 140 may be designed so as to protect the piezoelectric transducer 120 against mechanical bending stresses if the harvesting device 100, 800 is oriented horizontally or if there is a lateral component in the host vibration. Due to the low aspect ratio of the spacer 140 (r=length/outer diameter), it is estimated that a spacer 140 manufactured from three-dimensional printed polycarbonate will only allow a small static deflection in the order of a few μm, which is unlikely to be enough to damage the piezoelectric transducer 120.

Figure 7:
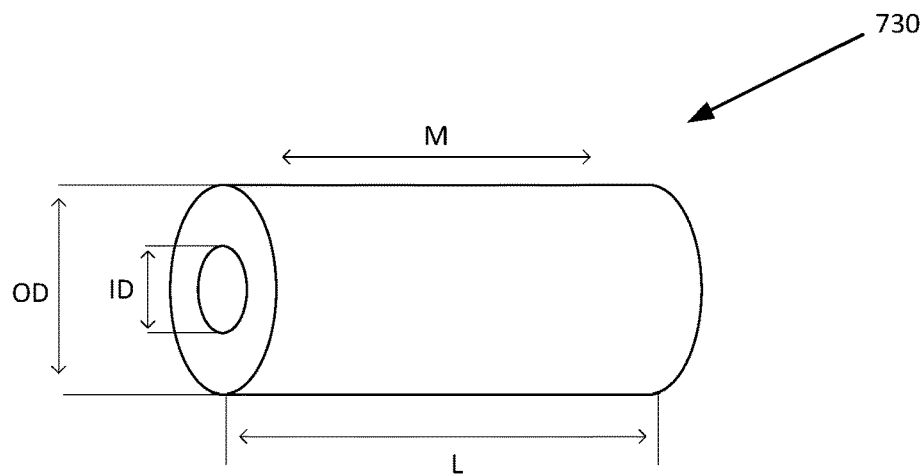
FIG. 7 illustrates an alternative magnet arrangement for the vibration energy harvesting device.
Figure 8:
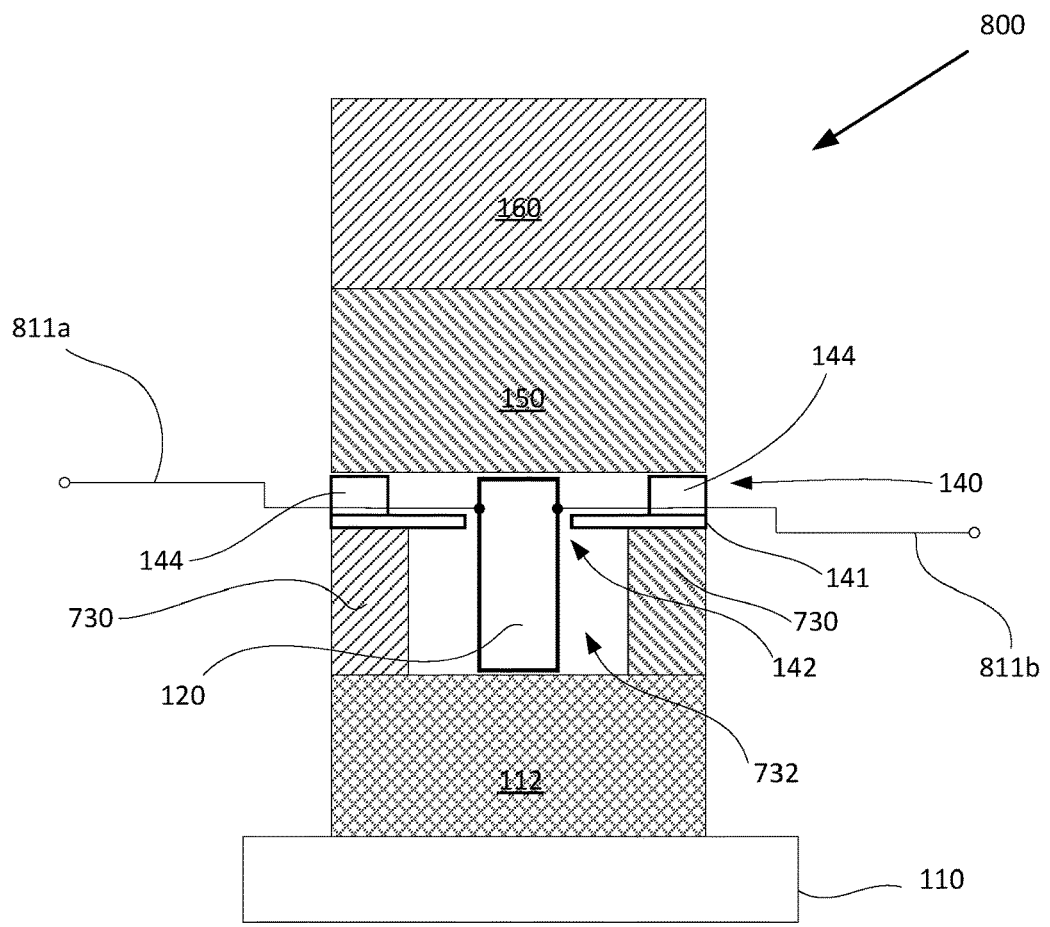
FIG. 8 is a schematic representation in side view of a vibration energy harvesting device according to some embodiments.

FIG. 7 illustrates a hollow cylindrical magnet as an example of a magnet configuration 730 that can be used in place of magnet configuration 130. Magnet arrangement 730 may be a single continuous body. An outside diameter (OD) of the magnet arrangement 730 may be generally similar to the outside diameter of the magnet arrangement 130 and also about the same as the outside diameter of first and second magnets 112, 150. Magnet arrangement 730 also has an inside diameter (ID) that defines an inner axial bore 732 that is large enough to accommodate the maximum dimensions of piezoelectric transducer 120 without contacting the piezoelectric transducer 120 during normal operation. Magnet arrangement 730 has an axial direction of magnetisation M that is aligned with the interior bore of the magnet body. A length (L) of the magnetic arrangement 730 is about the same as the length of the piezoelectric transducer 120, minus the axial length of the spacer 140. In other words, the axial length of the magnet arrangement 730 (and 130) plus the axial length of the spacer 140 and any alignment discs 135 (if present) is approximately equal to the length of the piezoelectric transducer 120. The magnet arrangement 730 defines a passage through which the piezoelectric transducer 120 extends, and the magnet arrangement 730 and the piezoelectric transducer 120 do not contact each other in the passage.

In some embodiments, the piezoelectric transducer 120 may be a RFSC with dimensions approximately 4 mm by 4 mm (width and depth) and approximately 12 mm in length. For piezoelectric transducers 120 in the form of a RFSC, the crystal may have a cross section between about 2×mm$^2$ and about 5×5 mm$^2$. Lengths of such crystals may be between about 5 mm and about 10 or 12 mm, and may be up to about 15 or 20 or even 75 mm, for example.

FIG. 8 is a schematic cross-sectional view of a vibration energy harvesting device 800 that is the same configuration as vibration energy harvesting device 100, except that device 800 uses magnet arrangement 730 and has the spacer 140 positioned between magnet arrangement 730 and second magnet 150. To avoid unnecessarily obscuring FIG. 8, adhesive layers 114, 116, 117 are not shown, although they are present as needed. Similarly, shims 115a, 115b are present between the first magnet 112 and the piezoelectric transducer 120 and between the second magnet 150 and the piezo electric transducer 120, although they are not shown in FIG. 8. FIG. 8 shows electrical conductors 811a, 811b, which may in the form of thin wires, for example, extending through gaps between ligaments 144 of spacer 140 to contact and electrically couple to opposite sides of piezoelectric transducer 120.

Figures 9A, 9B:
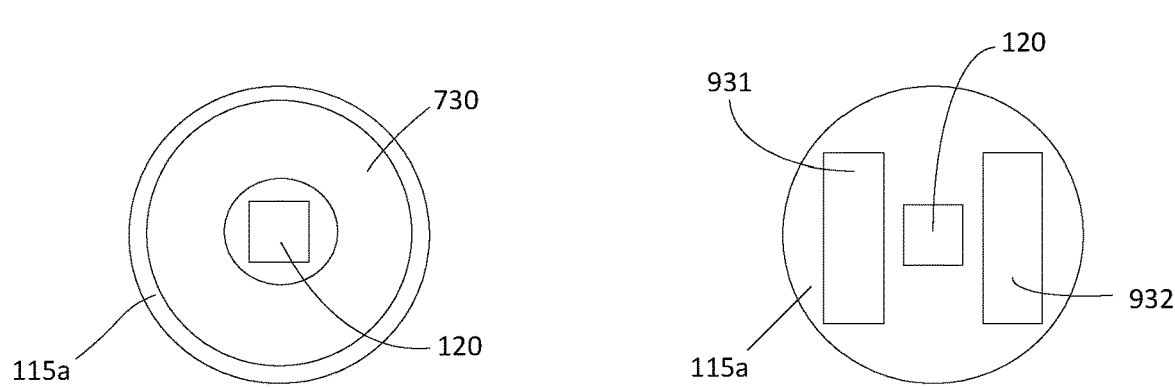
FIG. 9A is a top view from inside the vibration energy harvesting device showing a magnet arrangement around the piezoelectric transducer according to some embodiments.
FIG. 9B is a top view through the vibration energy harvesting device according to other embodiments, showing an alternative magnet arrangement around the piezoelectric transducer.

FIGS. 9A and 9B illustrate alternative magnet configurations. FIG. 9A shows a top view, looking proximally from the second magnet 150, of the continuous cylindrical magnet arrangement 730 as shown in FIGS. 7 and 8. Magnet arrangement 730 may have an outer diameter that is substantially the same as an outer diameter of the first magnet 112 and/or the second magnet 150.

FIG. 9B shows an alternative configuration in a top view, looking proximally from the second magnet 150, in which the magnet arrangement partially surrounds the piezoelectric transducer 120, but does not fully surround it. For example, the magnet arrangement that partially surrounds piezoelectric transducer 120 may include at least two magnetic bodies 931, 932 that are disposed on opposite (e.g. lateral, not axial) sides of the piezoelectric transducer 120. More than two magnetic bodies may be arrayed or arranged to at least partially surround piezoelectric transducer 120, such as three, four, five, six or more bodies. The at least two magnetic bodies 931, 932 may be arranged so that there is at least one axis of symmetry when viewed from the top as shown in FIG. 9B. The configuration of the magnet arrangements in the vibration energy harvesting devices 100, 800 can be varied, as long as a suitable spacer can be accommodated to separate axially adjacent magnetic components by a small distance so that a strong magnetic attraction between those axially adjacent magnetic components can be used to provide a relatively strong magnetic compression force to a compressible (soft) axis of a piezoelectric transducer 120.

Conversely, in other alternative configurations, the vibration energy transducer may include at least two piezoelectric transducer bodies that are disposed on opposite sides of a central or intermediate magnetic body. More than two piezoelectric transducer bodies may be arrayed or arranged to at least partially surround the central or intermediate magnetic body, such as three, four, five, six or more piezoelectric transducer bodies. The at least two piezoelectric transducer bodies may be arranged so that there is at least one axis of symmetry when viewed from the top.

In embodiments of the vibration energy harvesting device 100 and 800, the magnetic components 112, 130, 730, 150, the spacer(s) 135 and 140, the tip mass 160 and the piezoelectric transducer 120 are coaxial along a single axis 165 that extends between proximal and distal ends of the device 100, 800. Preferably, the magnetic components 112, 130, 730, 150, the spacer(s) 135 and 140, the tip mass 160 and the piezoelectric transducer 120 are concentric. In a rest (non-vibrating) position of the vibration energy harvesting device 100 and 800, each component is in contact with another axially adjacent component. The vibration energy harvesting device 100 and 800 have no air gaps other than in the spacer 140 and the hollow bore of the magnet arrangement 130, 730.

The compressive force applied to the piezoelectric transducer 120 (in the form of a suitable crystal as described herein) by the combination of the second magnet 150 and the magnet arrangement 730 has been estimated using the process described below.

A set of typical expected geometries for the magnet arrangement 730 are detailed in Table 1.

TABLE 1

Typical geometries for magnet arrangement 730.

| Outer Diameter, OD (mm) | Inner Diameter, ID of Middle Hollow Cylinder Magnet (mm) | Length, L of Middle Hollow Magnet Plus Lower Magnet* (mm) | Length, L of Upper Magnet (mm) |
|---|---|---|---|
| 20-40** | 10 | (12-Gap) + (OD/2) | OD/2 |

*The piezoelectric crystal transducer is assumed to have dimensions of 12 × 4 × 4 mm³.
'Gap' is given by the axial thickness of the spacer 140.
**It is noted that permanent rare earth magnet designs with OD >20 mm are challenging to manufacture and potentially dangerous to handle due to the large pull strength of the constituent magnets.

For an ideal permanent magnet, the magnetization M is independent of magnetic field H, which leads to a linear magnetic flux B-H demagnetisation curve in the second quadrant. The calculation of magnetic force requires the magnetisation M of the cylindrical magnet arrangements, rather than magnetic flux B. M is independent of H for an ideal permanent magnet, and so M in the cylinder would be equal to the remanent magnetisation $M_r$ if the magnet were ideal (i.e. for a N38H magnet, $M_r$=1.26T/$\mu_0$~1.003 MA/m, where $\mu_0$ is the permeability of free space (~$4\pi \times 10^{-7}$ H/m)). We do not assume an ideal magnet and use the actual B-H/M-H characteristics of the material, hence yielding somewhat lower values for M.

The shape demagnetisation factor of a cylinder $N_z$ was taken into account when determining the magnetic operating point through the permeance coefficient $P_C=[1-N_z]/N_z$, which determines the gradient of the load line. Table 2 provides examples of the permeance coefficient for various cylindrical geometries.

TABLE 2

Permeance Pc of various cylindrical geometries*.

| Cylinder Length L (m) | Aspect Ratio τ = L/2R | Shape Demagnet- isation $N_z$ | Per- meance $P_C =$ [1-$N_z$]/$N_z$ | Solid cylinder $P_c$ | Hollow cylinder with ID 10 mm $P_c$ |
|---|---|---|---|---|---|
| 0.002 | 0.1 | 0.81588 | 0.226 | 0.254 | 0.288 |
| 0.004 | 0.2 | 0.68901 | 0.451 | 0.468 | 0.533 |
| 0.006 | 0.3 | 0.59629 | 0.677 | 0.678 | 0.776 |
| 0.01 | 0.5 | 0.46984 | 1.128 | 1.102 | 1.268 |
| 0.014 | 0.7 | 0.38764 | 1.580 | 1.535 | 1.773 |
| 0.02 | 1 | 0.30705 | 2.257 | 2.202 | 2.545 |
| 0.04 | 2 | 0.18137 | 4.514 | 4.475 | 5.19 |
| 0.06 | 3 | 0.12870 | 6.770 | 6.791 | 7.871 |

*Assumes OD = 0.02 m, R = OD/2 = 0.01 m.

Figure 10:
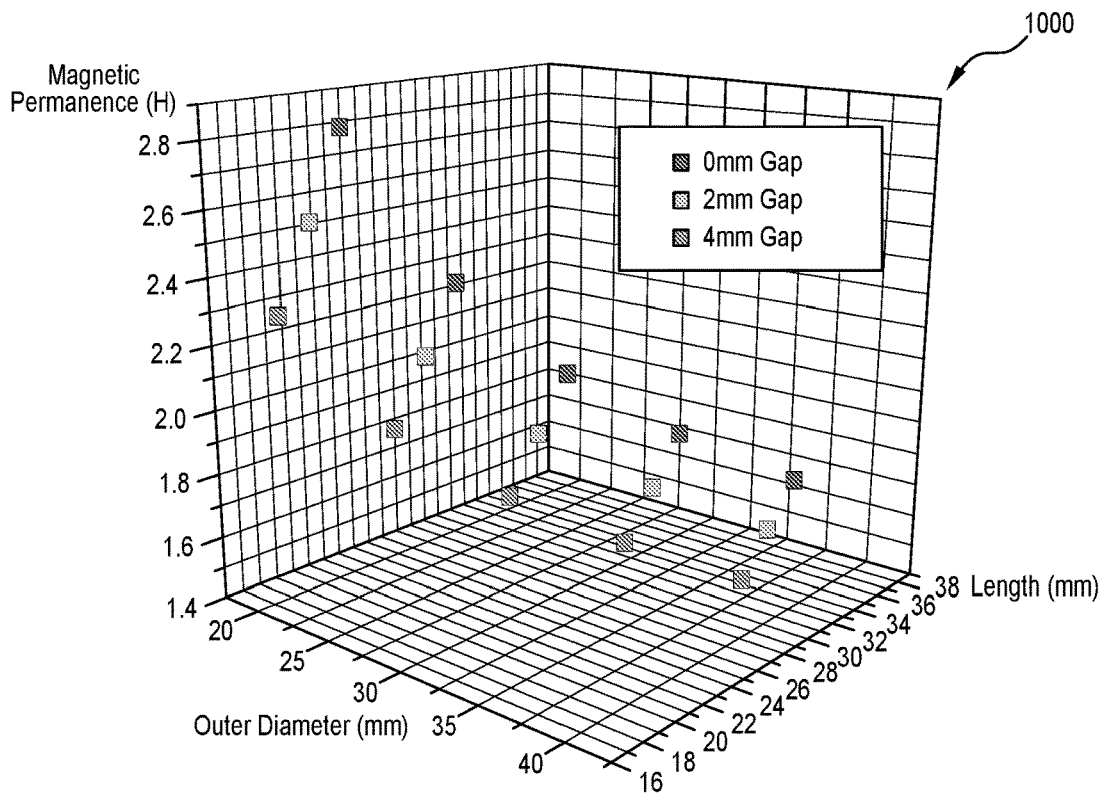
FIG. 10 is a 3D plot to illustrate magnetic permeance of a magnet arrangement versus at a diameter and length of the magnet arrangement for three different gap configurations.
Figure 11:
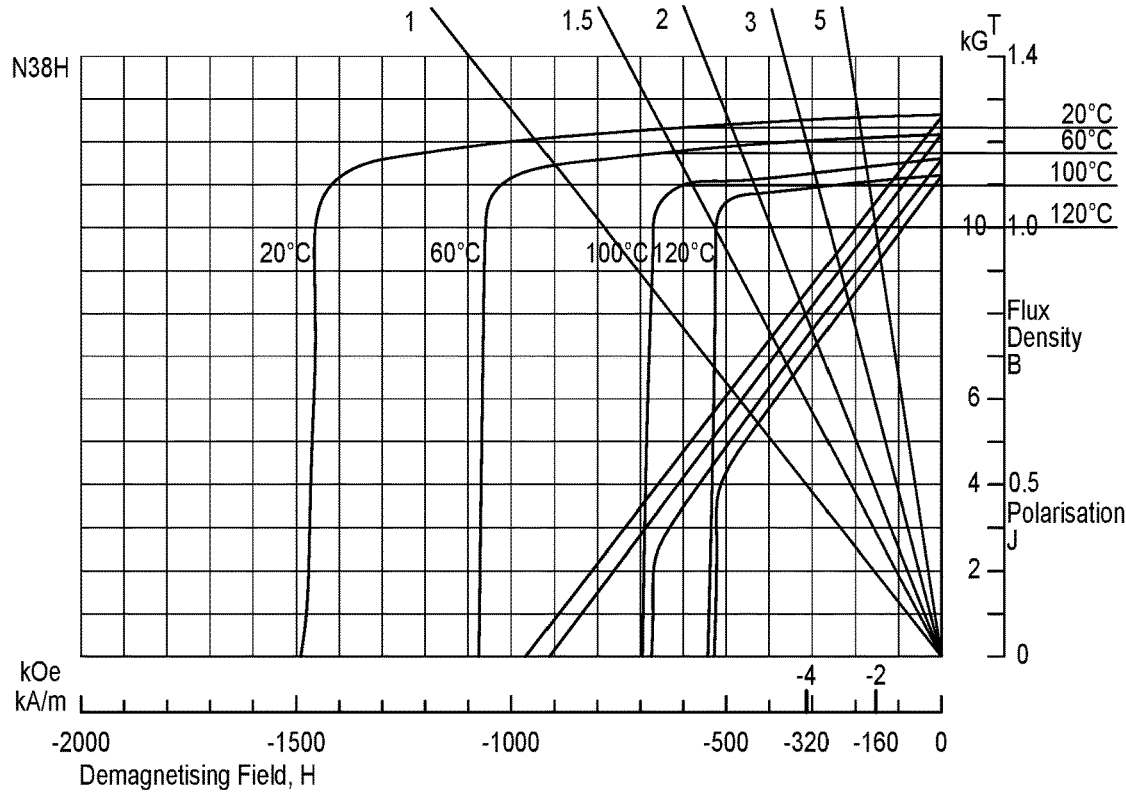
FIG. 11 is a plot of demagnetising fields versus flux density at certain temperatures of the magnetic arrangements.

For the purposes of calculating permeance, the operating temperature was assumed to be 100° C. A conservative estimate of the magnetic permeance of the cylindrical magnet arrangement was made, taking into consideration the tubular nature of the magnet arrangement 130, 730, and also the additional spacing due to the machinable glass shims 115a, 115b. The second magnet 150 was not included in the estimate of magnetic permeance, adding to the conservative nature of the estimate. FIG. 10 shows a plot 1000 of the predicted magnetic permeance as a function of geometry, indicating a minimum permeance $P_c$~1.5 H.

Using this conservative estimate of magnetic permeance, a magnetic load line (i.e. with a gradient equal to the permeance of 1.5) was mapped onto the data sheet for a typical high temperature Neodymium-Boron-Iron magnet (N38H). This allowed the B-H operating point to be determined, from which the magnetic polarization J could be estimated (see plot 1100 in FIG. 11, which is adapted from a plot in a document sourced from http://www.eclipsemagnetics.com/media/wysiwyg/brochures/neodymium_grades-_data.pdf as of 5 Mar. 2020 or earlier). Knowing the magnetic polarization J, the magnetization M can be calculated, which can then be used to find the magnetostatic energy constant $K_d$. This $K_d$ is conservative and reasonable for all of the magnetic geometries and temperatures (<=100° C.) considered.

The calculated $K_d$ is then substituted into the equation below (taken from equation 4 of David Vokoun, Marco Beleggia, Ludek Heller, Petr Sittner, "Magnetostatic interactions and forces between cylindrical permanent magnets", Journal of Magnetism and Magnetic Materials, 321 (2009) 3758-3763), allowing estimates of the magnetic force to be calculated, $$Fz \approx -8\pi KdR^2 \int_{q=0}^{+\infty} \frac{J_1^2}{q} \sinh(q\tau_1)\sinh(q\tau_2)e^{-q\epsilon}dq$$

where $F_z$ is the magnetic force, R is the radius of the cylinder, $\tau_i=t_i/(2R)$, i=1, 2, are the aspect ratios of the lower cylinder (consisting of the magnet arrangement 130 and the first magnet 112) and the upper cylinder (consisting of the second magnet 150), with $K_d = \mu_0 M^2/2$ and M being the magnetisation, permeability of free space $\mu_0 = 4\pi \times 10^{-7}$ N/A$^2$, $\in = Z/R$ is the reduced distance between the two cylinders, and $J_1(q)$ is the Bessel Function of the first kind.

Figure 12:
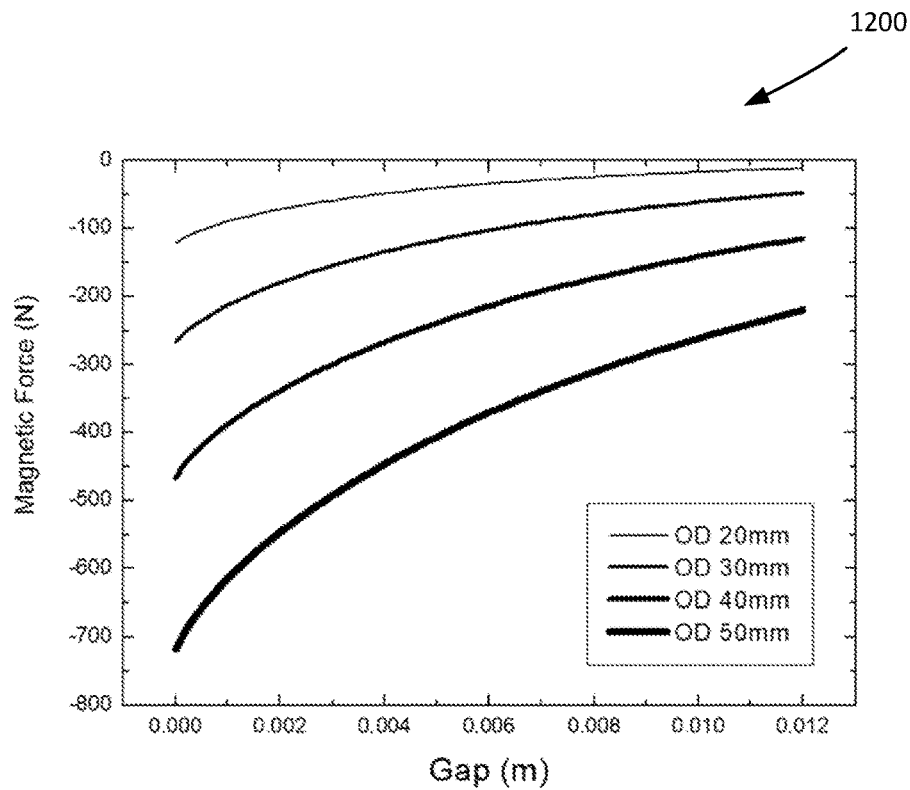
FIG. 12 is a plot of magnetic force versus separation gap due to the spacer, with different magnet outer diameters plotted.
Figure 13:
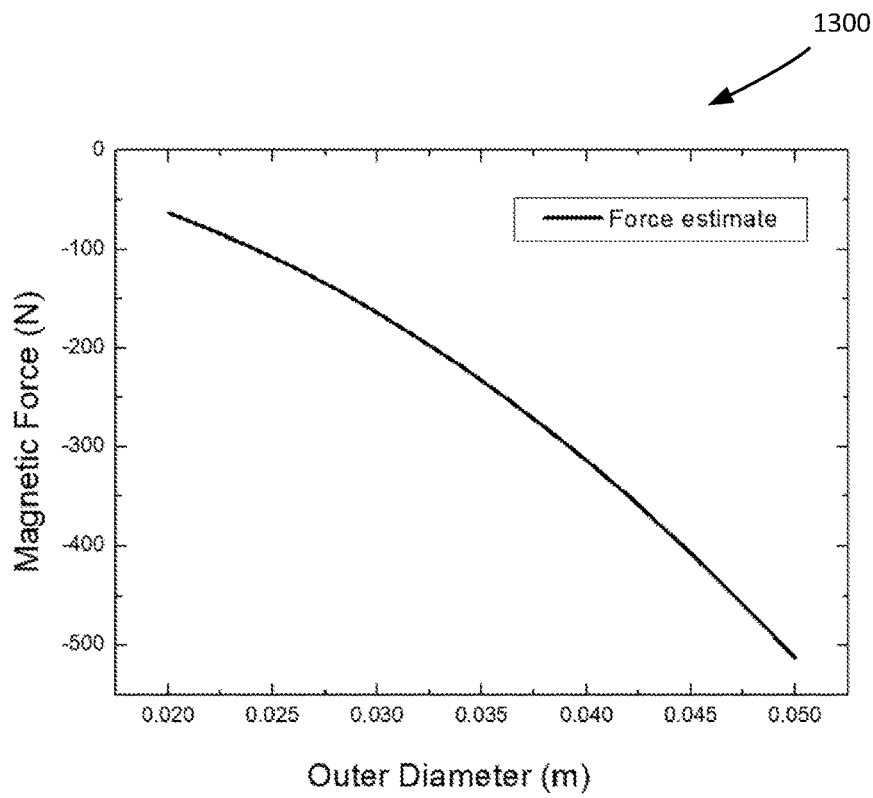
FIG. 13 is an example plot of magnetic force versus magnet outer diameter.

FIGS. 12 and 13 show plots 1200 and 1300 of the magnetic compressive force as a function of Gap (dictated by the axial thickness of the spacer 140) and outer diameter OD, respectively. For larger magnets, forces in the range of 100's of N are predicted, with 400 N of compression readily achievable. It is estimated that forces in the range of about 50 N to about 500 N can be achieved with the described axial arrangement of the vibration energy harvesting device 100, 800. A compressive force of 400 N is the force needed to generate a mechanical compressive stress in the range of 20 MPa, which is needed to utilise the phase transition mechanism for a RFSC within a resonant harvesting device, such as vibration energy harvesting device 100, 800, for example. Although operation of an energy harvesting device as described herein around the phase transition can lead to higher energy harvesting efficiency, such operation is not necessary and energy harvesting efficiency at other piezoelectric states can still be acceptable.

Figure 14:
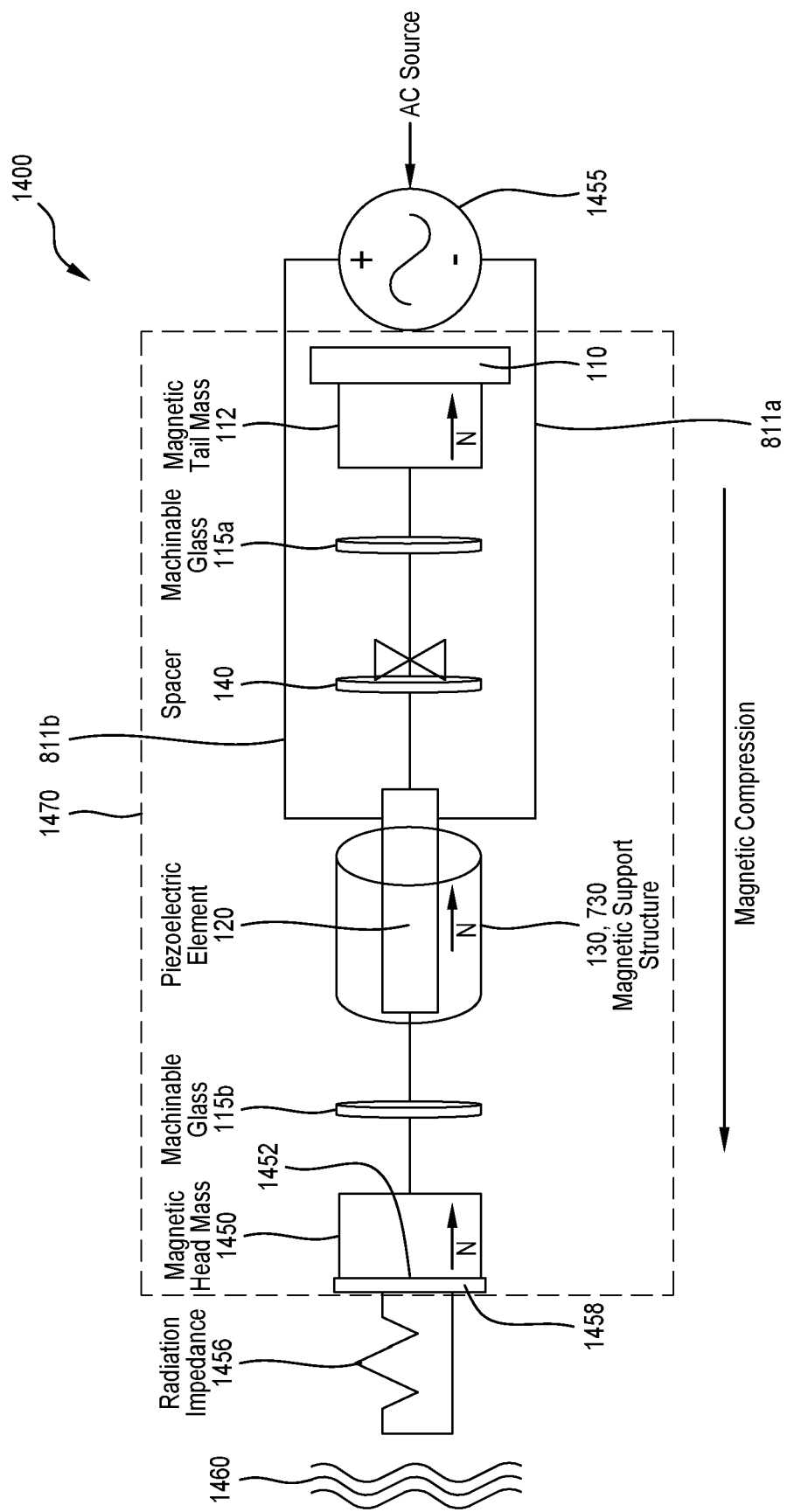
FIG. 14 is a schematic diagram of an electro-acoustic transducer device according to some embodiments.
Figure 22:
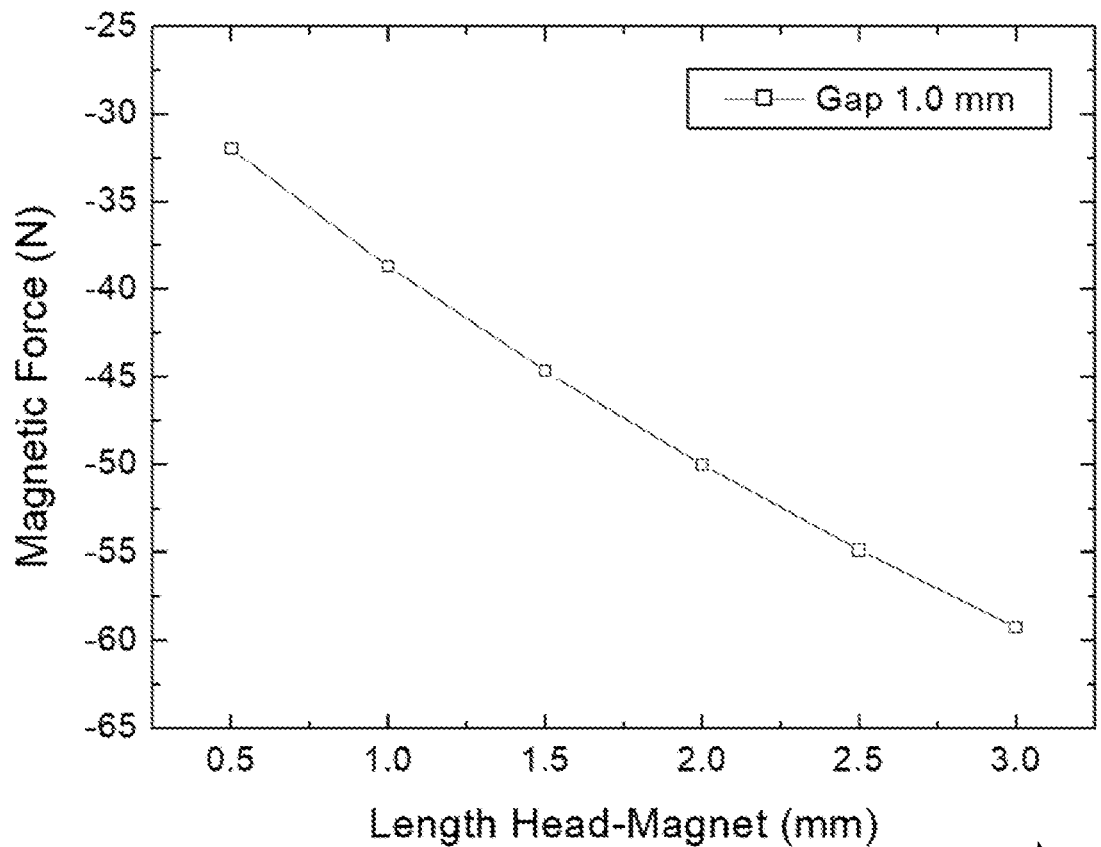
FIG. 22 is an example plot of head magnet length versus magnetic force for a selected axial gap spacing.

Exemplary design features for the magnetic pre-loading approach are shown in FIGS. 1, 6 and 14. A magnetic support structure, including magnet arrangement 130 or 730, is depicted schematically as a series of ring magnets around a rectangular piezoelectric plate-element, such as piezoelectric transducer 120, according to some embodiments. FIGS. 12, 13 and 22 show estimated or plotted relationships of device parameters (including magnet outer diameter, gap and head mass length) based on example device dimensions and configurations as described immediately below. In examples of such embodiments, the ring magnets may have an outer diameter rm-OD and inner diameter rm-ID, with each ring magnet having a height of approximately 1.65 mm and the total height of the ring magnets rm-H. The same rm-OD may be applied even where a single cylindrical magnet 730 is used instead of stacked ring magnets. The (distal) head magnet 150 is attracted to the magnetic support structure 130 or 730, applying a compression to both the piezoceramic element 120 and the spacer 140, and has an outer diameter similar to r-OD, and height hm-H~rm-OD/2. An additional head mass may be included (e.g. 160 in FIG. 1 or 6) which has diameter similar to rm-OD, with height selected to tune the device resonant frequency as needed. The tail magnet 112 completes the magnetic circuit, has a diameter similar to rm-OD, and a height similar to the height of the head mass 150 (hm-H).

An example spacer 140 is shown in FIG. 5, with vertical ligaments that are designed to have a mechanical stiffness approximately ten times less than the (crystal) piezoelectric transducer 120. The spacer 140 creates a gap in the magnetic circuit with height gap-H. Thin disks 114 of machinable glass (e.g. formed of Macor™) with height M-H=0.8 mm that protect the piezoelectric transducer 120 from damage during mechanical loading, can be located either end of the piezoelectric element 120 and optionally also between the ring magnets 130.

A total height of the ring magnets rm-H=(length of piezoelectric transducer)+(2*height of glass disks)−gap-H. Minor height variations can be addressed with very thin disk-layers of polymer, such as polycarbonate, between adjacent ring magnets, if required. Example embodiments employ a 12 mm×4 mm×4 mm RFSC element as piezoelectric transducer 120. The proof mass may consists of the head magnet and a single ring magnet, and the shims 114 and other trivial masses do not significantly impact device resonant frequency.

According to one vibration energy harvester embodiment of device 100, 800, 1400, an approximate static compressive magnetic force of 50N can be applied to the piezoelectric transducer 120 under vibration of maximum frequency ~4.5 kHz, with rm-OD=20 mm, rm-ID=10 mm, gap-H=4 mm, rm-H=(12+2*0.8)−4=9.6 mm, hm-H=10 mm.

According to another vibration energy harvester embodiment of device 100, 800, 1400, an approximate static compressive magnetic force of 500N can be applied to the piezoelectric transducer 120 under vibration of maximum frequency ~1.2 kHz (i.e. only head magnet as proof mass), with rm-OD=50 mm, rm-ID=25 mm, gap-H=3 mm, rm-H=(12+2*0.8)−3=10.6 mm, hm-H=25 mm.

In an acoustic projector embodiment of device 100, 800, 1400 with maximum drive frequency of 45 kHz (i.e. only head magnet 1450 as proof mass), an approximate static compressive magnetic force of 45N can be produced, with rm-OD=20 mm, rm-ID=10 mm, gap-H=1 mm, rm-H=(12+2*0.8)−1=12.6 mm, hm-H=1.5 mm. Further example modelled acoustic projector embodiments (modelled on a single 12×4×4 mm$^3$ RFSC that produces 2 microns of DC displacement under 90N compression) indicate that: for a vibration (drive) frequency of 8.75 kHz at 5 V drive voltage, a static compressive force of around 31.5N is needed; for a vibration frequency of 17.5 kHz at 5 V drive voltage, a static compressive force of around 15.8N is needed; for a vibration frequency of 42.2 kHz at 5 V drive voltage, a static compressive force of around 6.5N is needed; for a vibration frequency of 45 kHz at 5 V drive voltage, a static compressive force of around 6.1N is needed; for a vibration frequency of 45 kHz at 50 V drive voltage, a static compressive force of around 61.3N is needed; for a vibration frequency of 42.2 kHz at 50 V drive voltage, a static compressive force of around 65.3N is needed. Such modelled embodiments indicate that for vibration frequencies at or somewhat above about 50 kHz at 5 V drive voltage, a static compressive force of around 5N is needed. Further, such modelled embodiments indicate that a static compressive force in the vicinity of around 50N is feasible for vibration frequencies between about 300 Hz and about 8.75 kHz at 5-50 V drive voltage, is needed.

Such example embodiments illustrate some example device configurations and are presented to illustrate how different device configurations can lead to different static compressive forces and operate under different vibration or drive frequencies. Various other device configurations are possible based on the principles described herein and illustrated in the Figures, without departing from the described embodiments.

Referring further to FIG. 2, some embodiments are directed to a movable craft or fixed plant 200 that has a vibrating host structure 210 with the vibration energy harvesting device 100, 800 mounted in fixed relation thereto via mount 215. The craft or plant 200 may have multiple such vibration energy harvesting devices 100, 800 mounted to the same or different host structures 210. The craft or plant 200 may have one or more sensors 230 to monitor machinery conditions, for example. The energy output of the one or more vibration energy harvesting devices 100, 800 may be provided to one or more batteries 220 (or other electrical energy storage devices) that are electrically coupled to the one or more sensors 230. The one or more sensors 230 may then use the electrical energy from the batteries to provide output to a monitoring system 240, for example.

Some embodiments of vibration energy harvesting device 100, 800 are designed to be able to operate effectively at somewhat elevated temperatures to allow them to function properly in conditions normally experienced in operating plant or crafts 200. For example, vibration energy harvesting device 100, 800 may be designed to be able to operate with increased effectiveness at temperatures of 80-120 degrees Celsius.

Referring now to FIGS. 14 to 20, embodiments of transduction devices optimised for electro-acoustic transduction (including acoustic projection), but also suitable or modifiable for energy harvesting, will now be described. FIG. 14 is a schematic illustration of a vibration energy transducer optimised as an acoustic projector device 1400 that has similar components and principles of design to the vibration energy harvester 100, 800, except that acoustic projector 1400 is designed to convert electric energy from a current source 1455 to vibration energy to generate output pressure waves 1460. Embodiments of acoustic projector 1400 can also be used as a sensor device when it is not actively generating pressure waves. When acting as a sensor device, acoustic projector 1400 can transduce vibrations into electrical signals in the manner described above for vibration energy harvesting and the electrical signals can be processed by a separate processing device or circuitry associated with an acoustic projection system. Thus, acoustic projector 1400 is an example of an electro-acoustic transduction device that can emit pressure waves and receive (detect) pressure waves, for example at different times.

Acoustic projector 1400 includes a base 110, a magnetic tail mass analogous to first magnet 112, thin shims 115a, 115b, a piezoelectric element 120 at least partially surrounded by a magnetic support structure (such as magnet arrangement 130, 730), a spacer 140 and a head mass 1450. An alignment disc 135 may also be included in the axial stack of projector components in a similar manner to vibration energy harvesting device 100 where the geometry of the magnetic support structure allows for it. Such components are housed in a housing 1470.

Housing 1470 may include a case to enclose and hold the acoustic projector 1400 components together. The housing 1470 may also include a decoupling material between the case and the head mass 1450. In some embodiments, a soft sealing outer encasement, such as a rubber casing, surrounds part or all of the housing 1470. The housing 1470 may be a ferromagnetic material, such as steel, mu-metal or iron, for example, in order to complete a magnetic circuit with the components of the magnetic assembly including the magnetic tail mass 112, magnet arrangement 130, 730 and head mass 1450.

In some embodiments, head mass 1450 acts as both a distal magnet and the head mass. However, in some embodiments, the head mass 1450 includes a magnet as shown in FIG. 14 and an additional non-magnet mass, such as a tungsten carbide mass, for example. Head mass 1450 may also have an impedance matching layer 1458 and/or acoustic lens positioned on or adjacent its outer distal surface 1452. Alternatively, the impedance matching layer 1458 and/or acoustic lens may be used in place of the tungsten carbide mass.

The spacer 140 employed in the acoustic projector 1400 is substantially the same as the spacer 140 used in the vibration energy harvester 100, 800, although it may be positioned more proximally. For example, spacer 140 and acoustic projector 1400 may be disposed axially between the magnet arrangement 130, 730 and the magnetic tail mass 112. The shim 115a may be disposed between the spacer 140 and the magnetic tail mass 112. As with the vibration energy harvester 100, 800, the piezoelectric element 120 passes through an aperture in the spacer 140 and contacts the shim 115a, against which the piezoelectric element 120 is compressed at a proximal end by axial forces due to magnetic compression. At its distal end, piezoelectric element 120 abuts the distally positioned shim 115b, which is adhered to head mass 1450.

Acoustic projector 1400 applies an alternating current source 1455 to the piezoelectric element 120 (which may be formed of any of the piezoelectric crystal materials described above) to cause axial expansion and contraction at frequencies ranging from around 300 hertz to around 100 kHz. This small axial expansion and contraction is due to the selected orientation of the soft axis of the piezoelectric crystal chosen for the piezoelectric transducer 120. Resultant displacement of the piezoelectric transducer 120 may be in the order of 1 or 2 microns to around 100 microns, for example, depending on the mass of magnets in the magnet assembly, plus any additional head mass. Any of the piezoelectric materials discussed above in relation to vibration energy harvesting device 100 can be used for the piezoelectric element 120 in acoustic projector 1400.

The movement of the piezoelectric transducer 120 under the influence of current from AC source 1455 causes axial displacement of magnetic head mass 1450 at a frequency dictated by the frequency of the alternating current. Since the magnetic head mass 1450 is a free end of the acoustic projector 1400 (in contrast to the magnetic tail mass 112 and base 110 that are coupled to the housing 1470 and a host structure), vibrational axial displacement of an outer distal surface 1452 of the magnetic head mass 1450 causes pressure waves 1460 to propagate in a distal direction away from the acoustic projector 1400. Depending on the medium, substance or material at the distal end of the magnetic head mass 1450, a radiation impedance 1456 of the pressure waves 1460 may vary at the distal end of the acoustic projector 1400. In some embodiments, an impedance matching layer 1458 may be positioned on or adjacent outer distal surface 1452 to maximise the amplitude of the pressure wave in the target propagating medium. In such embodiments, the impedance matching layer 1458 may have variable properties, or may include a lens or lens system to align or focus the acoustic energy.

As with the vibration energy harvester 100, 800, the acoustic projector 1400 relies on magnetic compression of a piezoelectric transducer to apply a static compression load (e.g. between about 5N and about 550N, between about 5N and about 50N, between about 50N and about 500N or between about 90N and about 400N) and thereby operate the piezoelectric transducer 120 in a mode that provides effective electrical to vibration energy conversion. The spacer 140 serves to slightly separate the magnet arrangement 130, 730 that at least partially surrounds the piezoelectric transducer 120 from the magnetic tail mass 112 (in other embodiments, the head mass 1450) so that the magnets are separated by a small gap that yields strong magnetic attraction in order to result in relatively high compression forces on the piezoelectric transducer 120.

Figure 15:
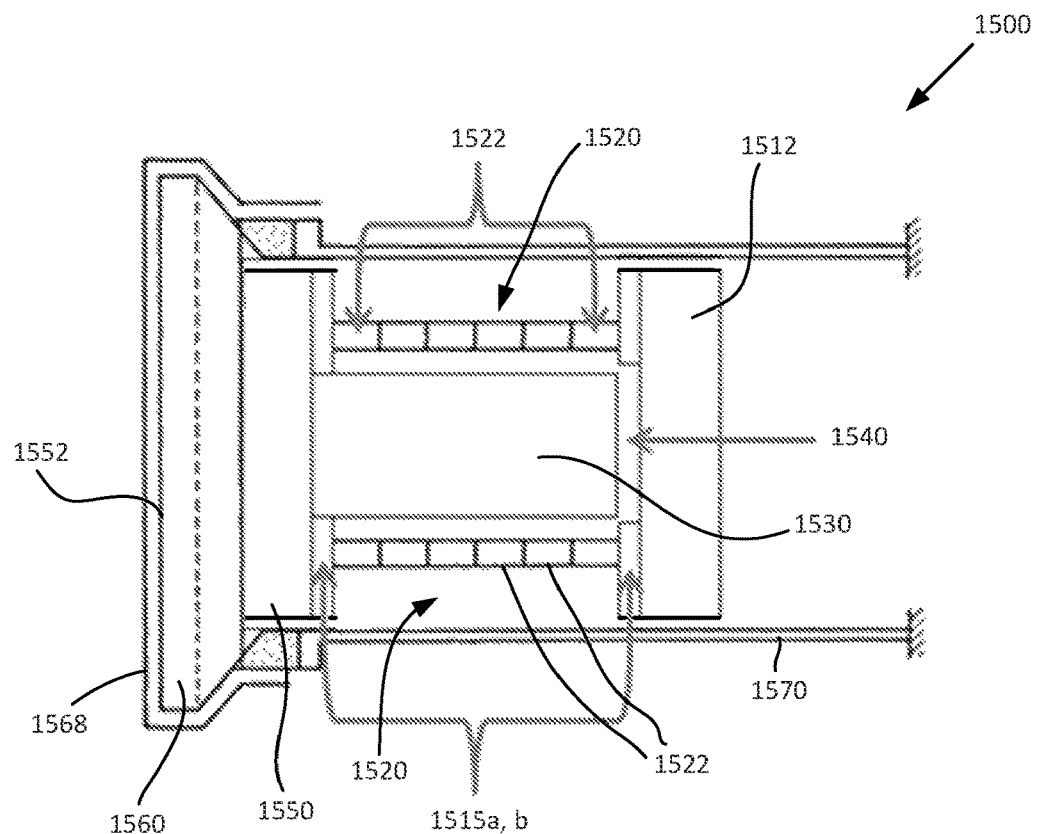
FIG. 15 is a schematic diagram of an electro-acoustic transducer device according to some embodiments.
Figure 16:
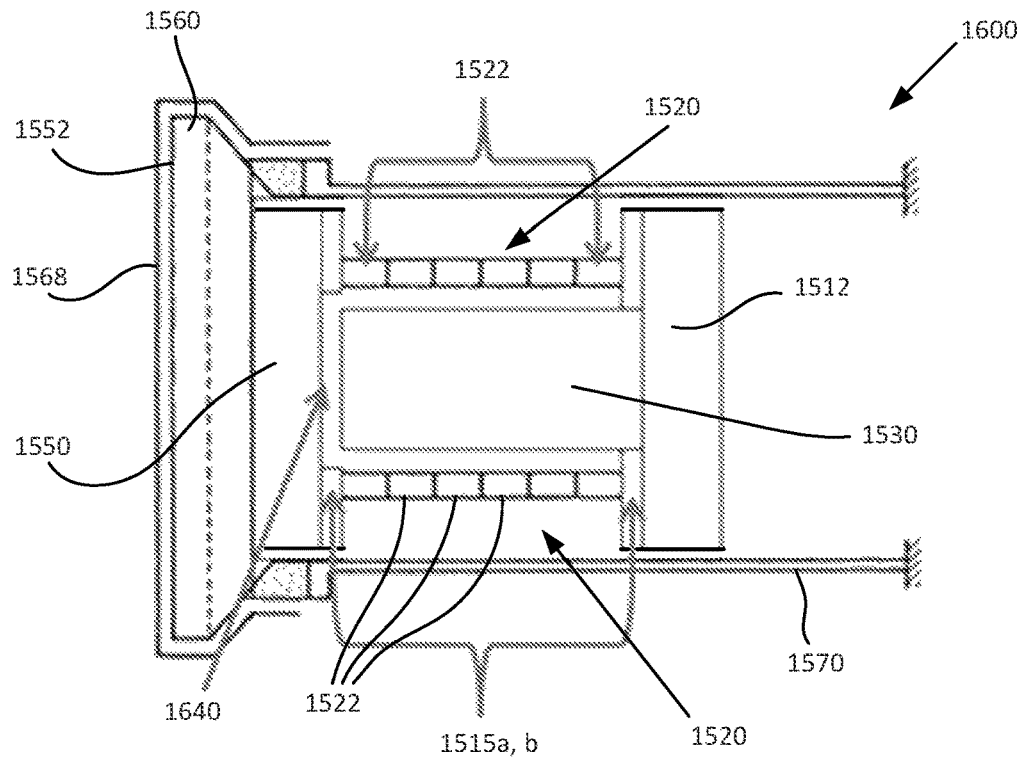
FIG. 16 is a schematic diagram of an electro-acoustic transducer device according to some embodiments.
Figure 17:
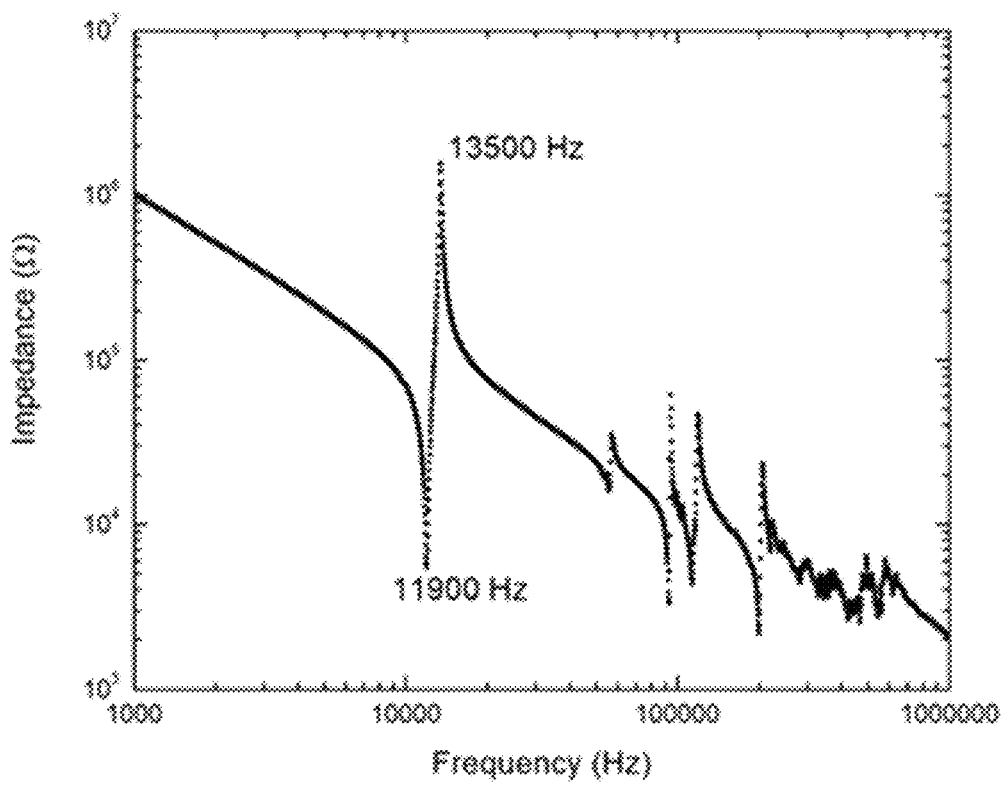
FIG. 17 is an example plot of the measured impedance vs frequency from an example electro-acoustic transducer device.

FIGS. 15 and 16 show schematic illustrations of alternative energy transduction device embodiments in the form of acoustic projectors 1500, 1600. Acoustic projectors 1500, 1600 are examples of electro-acoustic transduction devices. Acoustic projectors 1500, 1600 may resemble vibration energy harvesting device embodiments described herein but are optimised as acoustic projectors. Acoustic projectors 1500, 1600 are also suitable or modifiable for energy harvesting and/or detection purposes. In particular, acoustic projector devices described herein, such as acoustic projectors 1500, 1600, may be used as vibration detector devices. In such a context, acoustic projectors 1500, 1600 may be used to detect large or small pressure waves impinging on the distal projection/detection surface of the device by observing current fluctuations on electrodes that are electrically coupled to the piezoelectric transducer of such devices.

Referring first to FIG. 15, acoustic projector 1500 is similar in general design to the acoustic projector 1400, except that it has a magnet 1530 that is disposed at an axial centre, while a piezoelectric transducer 1520 is disposed coaxially and concentrically around the magnet 1530. Acoustic projector 1500 includes a magnetic tail mass 1512, shims 1515a, 1515b and a magnetic head mass 1550 in a similar configuration to acoustic projector 1400. In acoustic projector 1500, no physical spacer is interposed between the central magnet 1530 and the tail mass 1512. However, there is still an axial gap 1540 (of between about 0.2 mm and about 1 mm, for example) defined between the central magnet 1530 and the tail mass 1512 in order to induce a static compressive force due to magnetic attraction.

The components of acoustic projector 1500 may be wholly or at least in part housed in a housing 1570. The acoustic projector 1500 may also have an outer casing 1568 to at least cover its distal projecting surface, and optionally to cover most or all of the housing 1570. The outer casing may include a thin rubber or silicone sheet material, for example.

Magnet 1530 may include multiple magnet elements coupled together in a magnet arrangement or may comprise a unitary magnet body, for example. Electrical conductors (not shown) are coupled to the piezoelectric transducer 1520 in order to apply an excitation current from a varying current source, such as AC source 1455. Magnet 1530 may be affixed to the head mass 1550, for example by a suitable adhesive, in addition to being coupled to head mass 1550 by magnetic attraction.

Magnetic head mass 1550 may have an additional head mass 1560 coupled thereto on a distal face of the magnetic head mass 1550 in order to provide additional resonant mass for frequency tuning or impedance matching. In some embodiments, the additional head mass 1560 may have a distal outer surface 1552 that is greater in surface area than an axial cross-section of the magnetic head mass 1550 or shaped as an acoustic lens in order to generate larger acoustic wavefronts than would be possible with the magnetic head mass 1550 alone. In other embodiments, the magnetic head mass 1550 may define the distal outer surface 1552 and may be configured to have an increasing cross-sectional area in the distal direction in order to generate larger acoustic wavefronts.

The piezoelectric transducer 1520 may include multiple transducer elements 1522. Transducer 1520 may be arranged on opposite sides of, or at least partly around, the magnet arrangement. In some embodiments, piezoelectric transducer 1520 includes a series of axially stacked piezoelectric transducer elements 1522 that are generally of an annular or approximately annular form to extend fully or partway around the magnet 1530. In other embodiments, piezoelectric transducer 1520 may include a ringed or circumferentially spaced or positioned array of axially aligned single crystal transducer elements. The transducer elements of such an array may be wedge-shaped, for example, to allow them to fit together easily. Such a ringed array may resemble the array of ligaments 144 of spacer 140 shown in FIG. 5, for example. The ringed or circumferential array may have the piezoelectric transducer elements tightly or loosely packed in a generally circular or near-circular surrounding fashion about the magnet 1530. The ringed or circumferential array is preferably symmetric about at least two axes that are orthogonal to the proximal-to-distal (alignment) axis of the acoustic projector 1500. The piezoelectric transducer 1520 is arranged to have a central axis that is axially aligned with the rest of the acoustic projector 1500, including the magnet 1530, tail mass 1512 and head mass 1550.

The material of piezoelectric transducer 1520 and its constituent piezoelectric elements 1522 may be formed of or comprise one or more RFSC transducer elements as described above in relation to vibration energy harvesting embodiments or it may include more conventional piezoceramics, such as Navy Type lead zirconate titanate (PZT) compositions. Where relaxor ferroelectric single crystals are used for piezoelectric transducer 1520 or piezoelectric elements 1522, the crystals may be arranged in a d32-mode cylinder using [011] poled material. In described piezoelectric transducer arrangements for acoustic projectors 1500, 1600 using an array of multiple RFSCs, the high applied excitation voltage may be applied via electrical conductors (not shown) to the radially inner piezoelectric faces, with ground on the outer faces, the 3 direction oriented from the inside of the ring radially outwards, and the 1 direction aligned with the axial direction of the acoustic projector 1500, 1600.

Shims 1515a, 1515b are or may be formed of a thin (relatively soft) machinable ceramic material, such as Macor. Shims 1515a, 1515b are different from shims 115a, 115b in that they are annular and define central apertures through which the magnet 1530 passes.

Shim 1515a is proximally positioned and adhered to the tail mass 1512. Shim 1515a has a proximal end of the piezoelectric transducer 1520 abutting it. The material thickness and the central aperture of shim 1515a are sized to allow the magnet 1530 to pass partly into and out of the aperture as the piezoelectric transducer 1520 undergoes axial expansion or contraction in response to varying current from AC current source 1455. Shim 1515a thus acts as a spacer and may have a thickness slightly greater than the expected axial deflection of the piezoelectric transducer 1520. For example, if the maximum expected axial deflection is 1.0 mm, then the thickness of the shim 1515a may be about 1.2 mm.

Shim 1515b is distally positioned and adhered to the head mass 1550. Shim 1515b has a distal end of the piezoelectric transducer 1520 abutting it. The material thickness of the shim 1515b does not need to be the same as for shim 1515a and the central aperture defined by the annulus of shim 1515b need only be sized to allow the magnet 1530 to pass through it. Both shims 1515a, 1515b should at least provide sufficient flat surface area for contacting end faces of the piezoelectric transducer 1520.

Referring also to FIG. 16, a further acoustic projector embodiment is shown as acoustic projector 1600. Acoustic projector 1600 is the same as acoustic projector 1500, except that the magnet 1530 is coupled to the tail mass 1512 instead of the head mass 1550 and the functions and configurations of the shims 1515a, 1515b are reversed. In other words, the distal shim 1515b is the one that has a material thickness and central aperture sized to allow the magnet 1530 to pass partly into and out of the aperture as the piezoelectric transducer 1520 undergoes axial expansion or contraction in response to varying current from AC current source 1455. In acoustic projector 1600, shim 1515b thus acts as a spacer and may have a thickness slightly greater than the expected axial deflection of the piezoelectric transducer 1520. For example, if the maximum expected axial deflection is 1.0 mm, then the thickness of the shim 1515b may be about 1.2 mm.

Shims 1515a, 1515b may be suitable for their ability to allow a slight amount of surface deformation, thereby providing a slightly softer surface than most rare earth magnets and reducing the likelihood of fractures forming in the piezoelectric transducer 1520 (when formed as a crystal or including a series of crystals). However, in some embodiments, other analogously deformable materials may be used in place of shims 1515a, 1515b. Such analogous materials may be provided as a coating, layer, layer with material compositional gradient, or thin sheet, disposed on a distal side of the tail (first) magnet 1512 or a proximal side of the head (second) magnet 1550, for example. Such analogous materials may, for example, include a magnet-glass composite material with a higher glass concentration at a surface at which it is intended to contact the piezoelectric transducer 1520.

For acoustic projector 1500, the magnet 1530 may make direct contact with the head mass 1550 or may be separated therefrom by an adhesive bonding layer that is sufficiently thin that the magnetic attraction between magnet 1530 and head mass 1550 is negligibly affected. Similarly with acoustic projector 1600, the magnet 1530 may make direct contact with the tail mass 1512 or may be separated therefrom by an adhesive bonding layer that is sufficiently thin that the magnetic attraction between magnet 1530 and tail mass 1512 is negligibly affected.

In acoustic projector 1600, no physical spacer is interposed between the central magnet 1530 and the head mass 1550. However, there is still an axial gap 1640 (of between about 0.2 mm and about 1.0 mm, for example) defined between the central magnet 1530 and the head mass 1550 in order to induce a high (e.g. 5-500N or 50-500N) static compressive force due to magnetic attraction. For acoustic projectors 1500, 1600, no spacer is needed because mechanical loads, such as compression and bending, are taken up by the piezoelectric transducer 1520.

Other than as noted above, acoustic projector 1600 is the same as acoustic projector 1500. For example, the components, such as housing 1570, piezoelectric transducer 1520, tail mass 1512, head mass 1550, additional head mass 1560 and outer casing 1568 are shown by the same reference numerals in FIGS. 15 and 16.

Acoustic projectors 1400, 1500, 1600 and other energy transduction device embodiments described herein employ an arrangement in which the piezoelectric transducer 120, 1520 is coaxial with a magnet arrangement 130, 730 (or 931, 932 in FIG. 9B) or a magnet 1530. In some embodiments, the magnet arrangement 130, 730 or 931/932 extends in a direction parallel to an axis, such as axis 165, along which centres of the components are aligned and are positioned at one or more positions radially spaced (outward) from the central axis, with a piezoelectric transducer, such as piezoelectric transducer 120, being aligned with and extending along the central axis. In other embodiments, the radial positions of the magnet arrangement or magnet and the piezoelectric transducer are swapped. In these other embodiments, a piezoelectric transducer, such as piezoelectric transducer 1520, is positioned to have one or more constituent parts disposed radially outside a magnet, such as magnet 1530, which is aligned with and extends along the central axis. In this context, the term coaxial is intended to describe an arrangement where the centre of mass of the magnet arrangement or magnet is generally axially aligned with the centre of mass of the piezoelectric transducer, irrespective of exactly what form each magnet or piezoelectric component takes and how many constituent parts make up each magnet or piezoelectric component. The term coaxial also describes the axial alignment of the piezoelectric transducer 120, 1520 and magnet arrangement 130, 730 or magnet 1530 with the other device components, such as tail mass 112, 1512, head mass 150, 1550, shims 115a, 115b, 1515a, 1515b, alignment disc 135 (if present) and spacer 140 (if present).

In some embodiments, the magnet or piezoelectric components will have a generally circular or circular array configuration. In such embodiments, but also in non-circular embodiments (such as is depicted in FIG. 9B), the magnet and piezoelectric components may also be described as concentric, with the magnet component disposed radially inside the piezoelectric component or the piezoelectric component disposed radially inside the magnet component.

Acoustic projector devices described herein, such as acoustic projector 1400, 1500, 1600, may form part of an acoustic projection system including multiple such devices in combination. Such multiple acoustic projector devices may be located adjacent each other in an array or bank of such projectors, or they may be arranged at spaced locations. In such a system, multiple ones of the acoustic projectors may be directed in a substantially same direction and/or multiple ones of the acoustic projectors may be directed towards different directions.

As described herein, various embodiments apply a compressive mechanical pre-load to the piezoelectric transducer element of an acoustic projector. Some prior acoustic ultrasonic projector designs utilise an axial bolt/nut (otherwise known as a tie rod and sometimes called a stress rod) to provide a static compressive stress to the piezoelectric element. The greater the pre-stress, the larger the amplitude of operation permitted before the transducer is driven into tension, where it will typically fail (due to it being a ceramic).

The arrangement of magnets in combination in an axial magnet assembly as described herein provides an alternative source of static compressive stress to a tie rod. The described arrangement has an advantage of lower damping and a greater range of unhampered resonant motion, since no plate spring is required at the end of the tie rod. The magnetic arrangement is not limited to a single cylinder surrounding the piezoelectric element, but can be configured to have various numbers of magnets and spacers with varying geometries, examples of which are described above.

The results of magnetic calculations shown in Table 1 indicate the significant compressive force that can be produced using a magnetic pre-stress arrangement. This has multiple potential advantages for acoustic projection, such as:

Compact design for multiple applications, such as air-coupled and underwater systems, either as singular devices or in arrays, in areas such as structural health monitoring of air/land/aquatic based vehicles, as an exciter for sonic thermography, composite material manufacturing, and various underwater applications. Generally, the described acoustic projectors can be used wherever low frequency (300 Hz+) acoustic projection is already utilised.

Unhampered resonant motion of the head mass.

Cleaner acoustic mode shapes since the head mass movement is not compressively constrained by a centrally located tie rod.

Energy efficient operation due to inherently less resistance to motion than designs using a tie rod for compression.

Efficient transmission and sensitive signal reception at the resonant frequency of the device (which can be altered with various possible design considerations to roughly >300 Hz).

Significant amounts of pre-stress, which enable a piezoelectric crystal to be driven with a strong electric field since the transducer remains in compression (crystal ceramics lack durability when driven into tension).

The possibility of utilising the relaxor ferroelectric phase transition available in certain crystal compositions to increase the acoustic output (via the step change in crystal strain that occurs as the crystals go through the reversible transitions).

TABLE 3

Estimations of compressive force and mechanical behaviour of a magnetic system. The estimations are specific to device geometries based on or similar to those of devices 100, 800 and 1400.

| OD (mm) | Estimated Proof Mass* (kg) | Compressive Magnetic Force* (N) | Crystal Geometry (mm³) | Maximum Tip Deflection** (pm) | Effective Spring Const. (N/m) | Lowest Res. Freq. (Hz) | Max. Accel.*** (g) |
|---|---|---|---|---|---|---|---|
| 20 | 0.14 | 90 | 12 × 2 × 2 | 5 | 5e6 | 970 | 60 |
|  |  |  | 12 × 4 × 4 | 2 | 2e7 | 1940 |  |
| 40 | 1.0 | 400 | 12 × 2 × 2 | 80 | 5e6 | 350 | 35 |
|  |  |  | 12 × 4 × 4 | 20 | 2e7 | 710 |  |

*Proof mass includes maximum mass of magnets (bottom and middle) and additional tungsten carbide (WC) mass. Example geometries are defined in Table 1. Any additional WC mass is assumed to have the same geometry as the distal end magnets (e.g. top magnet).
**The deflection produced by the static compressive magnetic force is based on a transducer elastic modulus of 15 GPa. Maximum dynamic tip deflection is equal to the deflection produced by the static compressive magnetic force.
***Maximum acceleration is limited by the static deflection produced by the magnetic compressive force, and the lowest frequency that is achievable.

The results of magnetic calculations shown in Table 3 indicate the significant compressive force that can be produced using a magnetic pre-stress arrangement, and lowest resonant frequencies that can be achieved.

The key objective of an acoustic projector is to produce a relatively large mechanical displacement, which in turn radiates acoustic energy into the adjacent medium. For example, the dynamic strain of a vibrating piezoelectric bar can be approximated by:

$$S = \frac{8}{\pi^2} Q_m d_{ij} E$$

where S is the dynamic strain, $Q_m$ is the mechanical quality factor, $d_{ij}$ is the piezoelectric coefficient and E is the applied electric field. For the proposed magnetic compression arrangements, $d_{32}$ is chosen due to the compliant 2-axis and the benefits which stem from it, including lower operational frequencies and greater power density which is beneficial for a more efficient and/or portable design. As an example, a $3^{rd}$ generation RFSC has a large $Q_m$ (typically 1000), a large, $d_{ij}$ (typically 1000 pC/N), and a large $E_c$ (6 kV/cm); so is capable of producing large dynamic strains.

There are benefits to using $1^{st}$ generation RFSCs over more conventionally utilised piezoceramics. Such benefits include the lower modulus/higher compliance 2-axis, the higher coupling constant, and the higher piezoelectric strain constant; $3^{rd}$ generation RFSCs have these benefits as well as an exceptional $Q_m$, making it an ideal choice.

Predictions of dynamic strain are presented in Table 4. The crystal transducer geometry is assumed to be 4×4×12 mm³ and the value of the maximum voltage is assumed to be 0.4 $E_C$ (for a distance of 4 mm in the 3-direction). For demonstration purposes only the transducer is considered, the effect of the surrounding projector structure is ignored. The potential effects of crystallographic phase change are also ignored.

TABLE 4

Dynamic strain comparison of piezoelectric element types

| Transducer | $Q_m$ | $d_{32}$ | Maximum voltage V (E) | Dynamic strain (S) |
|---|---|---|---|---|
| PZT Type 1 | 1000 | 290 | 4800 | 1.128e−3 |

TABLE 4-continued

Dynamic strain comparison of piezoelectric element types

| Transducer | $Q_m$ | $d_{32}$ | Maximum voltage V (E) | Dynamic strain (S) |
|---|---|---|---|---|
| PMN-PT | 80 | −2100 | 1040 | 1.416e−4 |
| PIN-PMN-PT | 100 | −1800 | 2120 | 3.093e−4 |
| Mn-PMN-PZ-PT | 1000 | −900 | 2400 | 1.751e−3 |

Table 4 indicates that Mn-PMN-PZT is the most appropriate choice for transmission/projection, at least in air and at shallow water depths. Using Mn-PMN-PZ-PT as the electrical-to-mechanical transducer is beneficial for projection due to its high $Q_m$, large piezoelectric constant d, low elastic modulus $s^E$, and high coupling k. PIN-PMN-PT may be practical for sensory applications due to the sensitivity provided by its greater piezoelectric constant $d_{32}$ and coupling k. The acoustic projector devices 1400, 1500, 1600 described herein include both magnets and support structure that provides additional mass, and may include additional mass or stiffness since the magnets act as a spring in parallel with the crystal transducer. This effects the overall mechanical quality of the device through the following equation:

$$Q_m = \frac{\sqrt{Mk}}{D}$$

where M is the mass, k is the spring constant and D is the damping coefficient.

The proposed method of magnetic compressive pre-stress, when coupled with $3^{rd}$ generation piezoelectric elements, will allow the benefits described below.

The compliant 2-axis of the crystal transducer allows for lower operating frequency than devices manufactured using traditional piezoceramic transducers. Scattering losses typically increase with the $4^{th}$ power of frequency, however the size of the projector is inversely proportional to the working frequency when resonance conditions are required.

With sinusoidal tone burst excitations (as exemplified in FIG. 18) instead of a single rectangular, or "spike" pulse, the piezoelectric transducer 120, 1520 will be capable of a resonant response, increasing the signal projection efficiency and signal reception sensitivity of the device. After four interfaces (from the probe to the couplant(s), to the desired location and back again), there will only be a small percentage of the original acoustic energy left. This issue is partially mitigated by resonant operation.

A lower transmission frequency is helpful for sonotrodes (i.e. for ultrasonic machining, welding, and mixing), for example as a compact acoustic excitation device for sonic thermography with the benefits for acoustic propagation provided by low operational frequency, particularly, <=50 kHz.

With a significant static pre-load provided by the magnetic arrangement, the transducer will be compact and able to endure a large electrical excitation voltage without being driven into tension. This increases the operation capability and general durability of the system.

For acoustic projection devices, the matching of acoustic impedances in the head mass to both air and water is considered. When sound waves pass through an interface between two materials, only a portion of the energy is transmitted; the rest is reflected and otherwise lost. The proportion of the energy transmitted depends on how closely the acoustic impedance of the two materials matches. The frequency attenuation of air exponentially increases with frequency, therefore air-coupled ultrasound devices operate below 1 MHz.

The reflection and transmission coefficients are given by the following formulas (for a wave excitation perpendicular to the test plane):

$$R = \frac{Z_2 - Z_1}{Z_2 + Z_1}$$

$$T = \frac{2Z_1}{Z_2 + Z_1}$$

where R is the reflection coefficient and T is the transmission coefficient, with the wave travelling from a medium with acoustic impedance $Z_1$ to a medium with acoustic impedance $Z_2$, and $Z_i = \rho_i \times v_i$, $i=1, 2$, with $\rho_i$ the density and $v_i$ the velocity of sound in the medium. It is apparent that the closer the two values are to each other, the greater the transmission and lesser the reflection, hence the need to match acoustic impedances as closely as possible for a better signal-noise ratio. Typical acoustic impedances are shown for various commonly used materials in Table 3.

The energy transmission coefficient from one medium to another is calculated by the following formula (multipliable by 100 for percentage of energy transmission):

$$T_e = \frac{4Z_1 Z_2}{(Z_1 + Z_2)^2}$$

TABLE 5

The characteristic parameters of various materials and mediums.

| Material | Density (kg/m³) | Elasticity modulus (GPa) | Speed of sound in medium (m/s) | Impedance Z = Density × Speed of sound (×10⁶ Rayl) | Characteristic impedance of 20 mm diameter head mass, (Z * Area) |
|---|---|---|---|---|---|
| Air | 1.25 | n/a | 330 | 0.000413 | 0.52 |
| PLA | 600 | 1.4 | 1071 | 0.64 | 808 |
| Water | 1000 | n/a | 1500 | 1.50 | 1885 |
| ABS | 1050 | 2 | 1834 | 1.93 | 2420 |
| PEEK | 1260 | 3.6 | 1856 | 2.34 | 2939 |
| Polycarbonate | 1200 | 2.4 | 2270 | 2.72 | 3423 |
| PMMA | 1190 | 3 | 2775 | 3.30 | 4149 |
| Composite (typical) | 1600 | 70 | 3000 | 4.80 | 6032 |
| G-10, FR-4 Fibreglass | 1850 | 24 | 3589 | 6.64 | 8344 |
| Mn-PMN-PZT | 7900 | 14 | 1352 | 10.7 | 13417 |
| MACOR | 2520 | 66.9 | 5152 | 13.0 | 16316 |
| Cordierite | 2600 | 70 | 5189 | 13.5 | 16953 |
| Aluminium | 2690 | 68.3 | 5039 | 13.6 | 17033 |
| Steatite L-5 | 2710 | 138 | 7136 | 19.3 | 24302 |
| Titanium Alloy | 3760 | 107 | 5335 | 20.1 | 25206 |
| Mullite | 2800 | 150 | 7319.25 | 20.5 | 25753 |
| PZT | 7700 | 63 | 3161 | 24.3 | 30583 |
| Sintered AlNico (magnet) | 6900 | 100 | 3806 | 26.3 | 33009 |
| Aluminium Nitride | 3250 | 308 | 9735 | 31.6 | 39758 |
| Sm2Co17 (magnet) | 8400 | 120 | 3780 | 31.7 | 39897 |
| NdFeB (magnet) | 7500 | 160 | 4619 | 34.6 | 43531 |
| Alumina | 3970 | 314 | 8893 | 35.3 | 55368 |
| CW1000 Tungsten | 16960 | 280 | 4063 | 68.9 | 86597 |

Table 5 shows the parameters for a range of materials useful in acoustic projection models. The Table 5 parameters can be used for estimating acoustic transmission (for examples, see Tables 6 and 7 below).

Tables 6 & 7 show the benefit of acoustic impedance matching the projector to the medium. One way of accomplishing impedance matching is through optimising the interface materials shown in Table 5.

TABLE 6

An example of the benefit of additional coupling layers for acoustic energy transmission in air. Impedance matching the prototype design produces a 15× improvement in transmitted energy into air.

| | Energy transmission coefficient (Te) | Energy Transmitted % (Te * 100) |
|---|---|---|
| Existing prototype design: MN-PMN-PZT to MACOR shim, to NdFeB, to air | 3.74e−5 | 0.0037 |
| Addition layers for improved acoustic impedance matching: MN-PMN-PZT to Fr-4, to PMMA, to PEEK, to air | 5.74e−4 | 0.0574 |

TABLE 7

An example of the benefit of additional coupling layers for acoustic energy transmission in water. Impedance matching the prototype design produces a 6× improvement in transmitted energy into water.

| | Energy Transmission coefficient (Te) | Energy Transmission % (Te * 100) |
|---|---|---|
| Existing prototype design: MN-PMN-PZT to MACOR shim, to NdFeB, to water | 1.25e−1 | 12.5 |
| Addition layers for improved acoustic impedance matching: MN-PMN-PZT to Fr-4, to PMMA, to PEEK, to water | 7.76e−1 | 77.6 |

An inherent weakness of air-coupled ultrasound is the low acoustic impedance of air, which is typically $10^4$ times lower than other materials (compare Table 6 for air with Table 7 for water). This leads to small values of acoustic energy transmission, diminishing but not eliminating the effects of acoustic impedance matching. However, the unhampered resonant motion of a device using magnetic compressive pre-loading (as opposed to using a tie rod) may counteract this by providing greater electrical to mechanical efficiencies.

Figure 19:
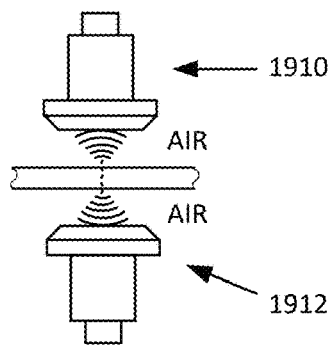
FIG. 19 is a schematic diagram illustrating normal air-coupled ultrasound through-transmission.
Figure 20:
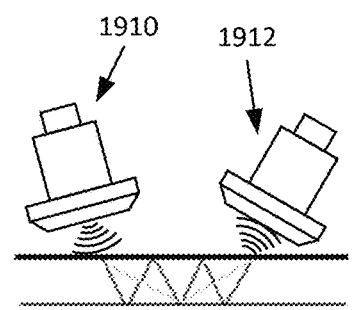
FIG. 20 is a schematic diagram illustrating air-coupled ultrasound transmission from a transmitter and receiver on a same side of a transmission medium.
Figure 18:
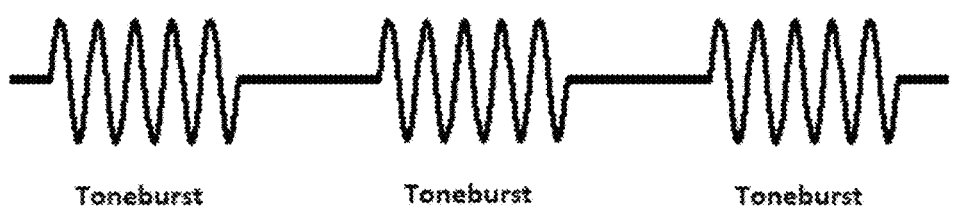
FIG. 18 is a schematic illustration of sinusoidal tone bursts.

A magnetically pre-stressed air-coupled acoustic projector can be used to produce Lamb/Plate waves which can travel significant distance in suitable materials, especially at a low frequency. An example through-transmission arrangement that uses a separate transmitter 1910 and receiver 1912 is shown in FIG. 19. It is possible to arrange the measurement such that the air-coupled transmitter 1920 and receiver 1912 are on opposite sides of the test piece, as shown in FIG. 19, or on the same side of the test piece, such as shown in FIG. 20. The air-coupled transmitter 1910 may measure line segments instead of single points, greatly increasing testing speeds in applications where precise imaging is not required. It is contemplated that acoustic projector embodiments 1400, 1500, 1600 may be used for the transmitter 1910 in the arrangements shown in FIGS. 19 and 20. It is also contemplated that such acoustic projector embodiments 1400, 1500, 1600 may be used in an acoustic detection mode for the receiver 1912 in the arrangements shown in FIGS. 19 and 20. In some embodiments, the receiver 1912 can be or include a sensor (other than vibration energy transduction devices described herein) that is configured to directly or indirectly sense an output or effect from or induced by the transmitter 1910. Examples of such a sensor include a thermal camera or a scanning laser vibrometer. In such embodiments, acoustic energy from the transmitter may excite radiation, damage or another thermally or optically detectable effect in the test piece or other interposed medium that can be detected by the receiver 1912.

Underwater acoustic technology may be used for industrial and scientific purposes. Active sonar transmits and receives echoes returning from the target, while passive sonar only intercepts noise radiated by an external target source. Examples of industrial and scientific applications include but are not limited to:

(i) bathymetric sounders which measure water depth,
(ii) fishery sounders designed to detect and localise aquatic lifeforms,
(iii) sidescan/multibeam sonars used for the acoustic imaging of the seabed,
(iv) sediment profilers used to study the internal structure of the seabed,
(v) acoustic communication systems used to transmit digital data,
(vi) positioning systems to locate platforms,
(vi) acoustic Doppler systems used to measure the speed of sonar relative to a fixed medium, or the speed of water relative to a fixed instrument and
(vii) acoustic tomography, used to assess hydrological perturbations.

Figure 21:
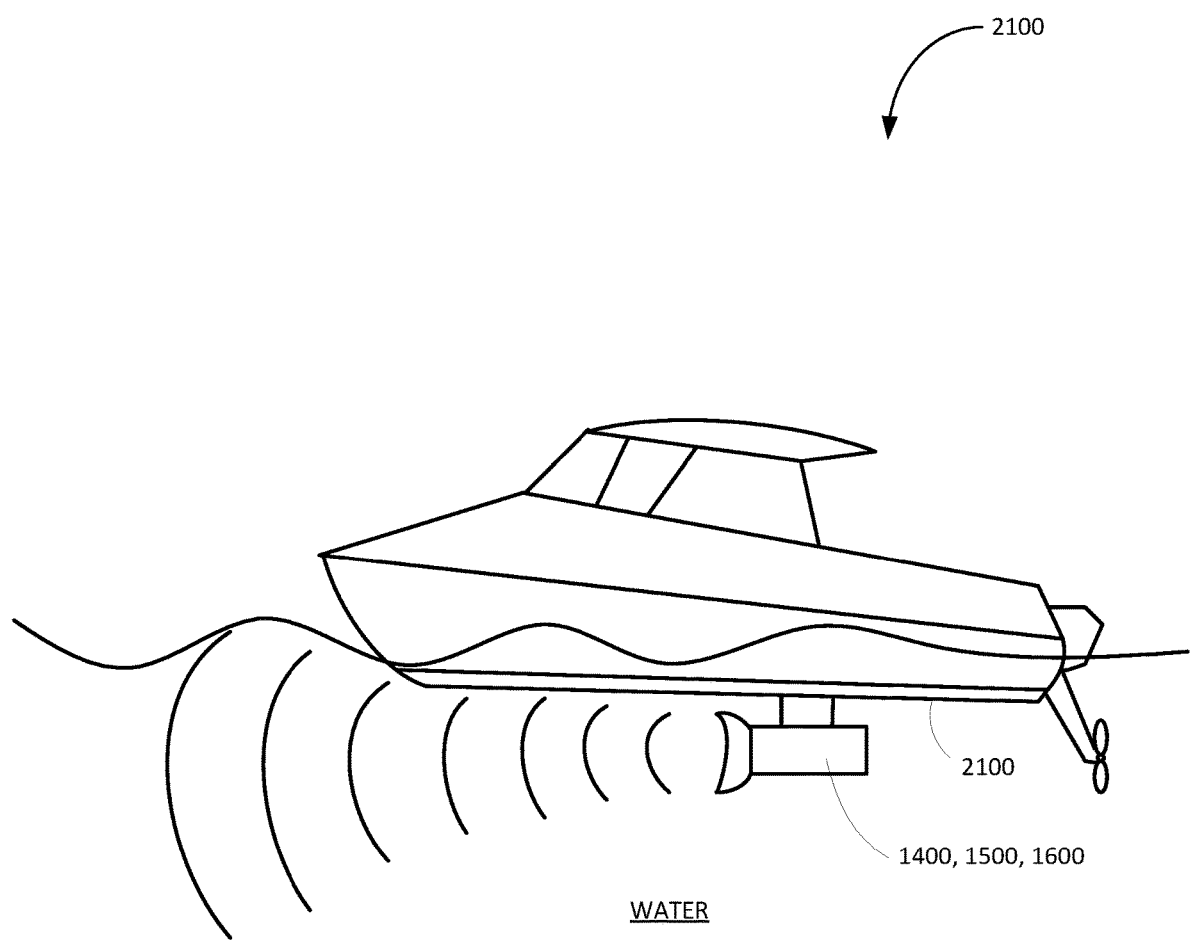
FIG. 21 is a schematic illustration of an example craft carrying an electro-acoustic transduction device according to some embodiments.

For oceanography, high powered low frequency projectors are desirable. The low power output of the design can be compensated for by the use of multiple electro-acoustic transduction devices, such as multiple individual acoustic projector devices 1400, 1500, 1600, in an array. An example oceanographic application is illustrated in FIG. 21 by a craft 2100, such as a water craft, that has an electro-acoustic transduction device, which may be an acoustic projector 1400, 1500, 1600, for example, mounted to amounting body, such as an underside of the hull 2110 of the craft 2100. The watercraft may include a boat, ship or submarine, for example. In some embodiments, multiple ones of the electro-acoustic transduction device (e.g. in the form of acoustic projector 1400, 1500, 1600) may be mounted to one or more mounting bodies to project vibration (acoustic) energy away from the one or more mounting bodies. The one or more mounting bodies may include the hull 2110 and/or mounting structures that are in turn mounted to the hull 2110. In other examples, the one or more mounting bodies may include a movable craft other than a watercraft or one or more static mounting bodies, such as pylons, walls or fixed surfaces that face toward a fluid volume, such as water or air. The multiple electro-acoustic transduction devices may be directed to emit or detect pressure waves to or from the same or multiple directions. Such multiple transduction apparatus/device embodiments may form part of an acoustic projection system or an acoustic detection system (e.g. including or as part of craft 2100) that includes mounting structure/mounting bodies and suitable control systems and power supplies for operation of such systems.

The Figure of Merit (FoM) for piezoelectric transducers in underwater applications is $d_{ij}Q_m$ which is associated with initial acoustic velocity and/or $k^2Q_m$ which is associated with electroacoustic efficiency. Given the already mentioned properties of the proposed magnetic arrangement, in particular a high $Q_m$, resonant motion and the potential for crystallographic phase change, it can be inferred that:

The high drive power enabled by the significant, compact pre-stress loading mechanism (not to mention the potential for crystallographic phase change) enables a strong signal emission due to the crystal being kept in compression instead of reaching tension. Some existing designs use a tie rod to pre-stress a piezoelectric transducer, but the tie rod is bulkier than acoustic projector embodiments described herein and dampens the resonant response of the device.

High $Q_m$ results in a narrow bandwidth and high power.
The unhampered resonant motion of the head mass permitted by the design produces more efficient pressure wave transmission and greater sensitivity to received pressure waves.
Due to the simplistic design, manufacture is simple and consistently repeatable with easily accessible materials.

The low-power and low-directivity of individual low-frequency projectors can be overcome by assembling several of them in a close-packed array with suitable control by a local controller that controls excitation currents to each of the acoustic projectors. This can result in a larger source level and increased directivity when compared to a single acoustic projector.

An array of acoustic projectors utilising magnetic pre-stress may be configured such that it does not require individual housing cases for each acoustic projector. Potentially, the magnetically active individual acoustic projector may be arranged in an appropriate magnetic circuit to optimise the pre-stress on an individual acoustic projector.

Tonpilz acoustic projectors can be used as hull-mounted underwater electro-acoustic transducers, for example in the manner illustrated in FIG. 21. They utilise a stack of ring-shaped piezoelectric material with an axial tie rod, with the rings polarised along the length of the stack with alternating polarity, interspersed with electrodes, bonded together and electrically connected in parallel. Tonpilz projectors are mounted within sturdy, water-tight housings, with the front radiation surface covered with an acoustically transparent rubberised "boot".

The resonant frequencies of Tonpilz transducers are greater than that of barrel-stave flextensional transducers, examples of which have been found to resonate at >1000 Hz. The Tonpilz example shown by Takeshi Inoue et al (1990 *Jpn. J Appl. Phys.* 29 56) ("Inoue et al") has a resonant frequency of ~7300 Hz. A 2019 paper describing the design, optimization, manufacture and characterization of a Tonpilz-type transducer for low frequency applications had a resonant frequency of ~4600 Hz.

The device shown by Inoue et al is optimised for a low operational frequency. The Inoue et al paper shows that the volume of their Tonpilz transducer (including everything minus the housing case) is approximately 486 $cm^3$, whereas the acoustic projector device 1400 (FIG. 14) with a 2 cm long tungsten carbide tip mass has a volume of approximately 27 $cm^3$ (5.6% of volume of the device in Inoue et al). The mass of the prototype of acoustic projector device 1400 is ~6% of the design in Inoue et al, and the volume of the piezoelectric element is ~0.5% of the design in Inoue et al. This demonstrates the compact form that the proposed magnetic pre-stress arrangement allows.

Vibration energy transduction devices according to embodiments of the present disclosure advantageously do not employ non-magnetic mechanical compression mechanisms to exert the static compressive force. For example, embodiments do not use (are free of) a tie rod for exerting the static compressive force on the piezoelectric transducer 120.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. An energy transduction apparatus, including:
a base;
a first magnet coupled to or comprising the base;
a piezoelectric transducer disposed adjacent the first magnet;
a magnet arrangement co-axial with the piezoelectric transducer, wherein the magnet arrangement is disposed on opposite sides of or at least partly around the piezoelectric transducer, or the piezoelectric transducer is disposed on opposite sides of or at least partly around the magnet arrangement, wherein the magnet arrangement is poled to have a first end of the magnet arrangement attracted to the first magnet;
a second magnet poled to be attracted to a second end of the magnet arrangement that is opposite the first end;
a vibratable mass coupled to or comprised by the second magnet;
electrical conductors electrically connected to the piezoelectric transducer to conduct current between the piezoelectric transducer and external circuitry; and
wherein the first magnet, the piezoelectric transducer, the magnet arrangement, and the second magnet are substantially coaxial;
wherein the first magnet, the second magnet and the magnet arrangement cooperate to keep the piezoelectric transducer in compression;
wherein vibrational movement of the second magnet is directly related to compression of the piezoelectric transducer and current flow in the electrical conductors; and
wherein the apparatus is configured to convert current in the electrical conductors into vibration of the vibratable mass in a frequency range of about 300 Hz to about 100 kHz to thereby act as an acoustic projector.

2. The apparatus of claim 1, wherein the magnet arrangement is disposed at least partly around the piezoelectric transducer.

3. The apparatus of claim 1, wherein the vibratable mass comprises a resonant mass.

4. The apparatus of claim 1, wherein the piezoelectric transducer includes a relaxor ferroelectric single crystal (RFSC).

5. The apparatus of claim 4, wherein the piezoelectric transducer includes a ternary piezoelectric single crystal.

6. The apparatus of claim 4, wherein the piezoelectric transducer is a PMN-PT or PZN-PT crystal.

7. The apparatus of claim 4, wherein the piezoelectric transducer is a PIN-PMN-PT crystal.

8. The apparatus of claim 4, wherein the piezoelectric transducer is a Mn-PIN-PMN-PT crystal or a Mn-PMN-PZT crystal.

9. The apparatus of claim 4, wherein a piezoelectric crystal of the piezoelectric transducer is poled [011] and arranged to operate in transverse extension (3-2) mode, with a 2 axis of the piezoelectric crystal being substantially coaxial with the first magnet, the magnet arrangement, the spacer, the second magnet and the vibratable mass.

10. The apparatus of claim 1, wherein the first magnet, the magnet arrangement and the second magnet are rare earth magnets.

11. The apparatus of claim 1, further comprising a first thin shim disposed between the first magnet and a first end of the piezoelectric transducer and a second thin shim disposed between the second magnet and an opposite second end of the piezoelectric transducer.

12. The apparatus of claim 11, wherein the first thin shim and the second thin shim are formed of a machinable glass ceramic material.

13. The apparatus of claim 1, wherein the piezoelectric transducer includes a spacer positioned between the first magnet and the second magnet, the spacer being significantly more compressible than the magnet arrangement and the piezoelectric transducer.

14. The apparatus of claim 13, wherein the spacer defines an aperture to receive the piezoelectric transducer therethrough.

15. The apparatus of claim 13, wherein the spacer has an axial thickness of between about 1 mm and about 3 mm when the vibratable mass is at rest.

16. The apparatus of claim 15, wherein the spacer has an axial thickness of between about 2.4 mm and about 2.8 mm when the vibratable mass is at rest.

17. The apparatus of claim 1, wherein the magnet arrangement defines a passage through which the piezoelectric transducer extends, and wherein the magnet arrangement and the piezoelectric transducer do not contact each other in the passage.

18. The apparatus of claim 17, wherein the magnet arrangement is symmetrical about multiple axes.

19. The apparatus of claim 17, wherein the magnet arrangement comprises a unitary magnet body.

20. The apparatus of claim 17, wherein the magnet arrangement comprises multiple magnet bodies fixed in position relative to each other.

21. The apparatus of claim 20, wherein an axial spacer is disposed between two of the multiple magnet bodies.

22. The apparatus of claim 20, further including an alignment disc disposed between and coaxial with two of the multiple magnet bodies, the alignment disc defining an alignment aperture in a centre of the alignment disc to receive and axially align the piezoelectric transducer.

23. The apparatus of claim 22, wherein the alignment disc is formed of a magnetically inert material.

24. The apparatus of claim 17, wherein the magnet arrangement is substantially cylindrical.

25. The apparatus of claim 13, wherein the spacer comprises a plurality of compressible ligaments arranged to separate the magnet arrangement and the second magnet, wherein an axial length of the piezoelectric transducer is substantially the same as a combined axial length of the spacer and the magnet arrangement.

26. The apparatus of claim 1, wherein the magnet arrangement and the second magnet are configured to exert between about 50 Newtons and about 500 Newtons of substantially static compressive force to the piezoelectric transducer.

27. The apparatus of claim 1, wherein the magnet arrangement and the second magnet are configured to exert between about 5 Newtons and about 50 Newtons of substantially static compressive force to the piezoelectric transducer.

28. The apparatus of claim 1, wherein the apparatus is configured to convert current in the electrical conductors into vibration of the vibratable mass in a frequency range of about 300 Hz to about 50 kHz to thereby act as an acoustic projector.

29. The apparatus of claim 1, wherein the magnet arrangement is disposed concentrically with the piezoelectric transducer.

30. The apparatus of claim 29, wherein the piezoelectric transducer at least partially surrounds the magnet arrangement.

31. The apparatus of claim 29, wherein the piezoelectric transducer comprises multiple stacked piezoelectric transducer elements.

32. The apparatus of claim 29, wherein the magnet arrangement comprises a cylindrical magnet that is one of:
  in contact with the first magnet or the second magnet but not both; and
  in contact with a thin bonding layer that bonds the cylindrical magnet to the first magnet or the second magnet.

33. The apparatus of claim 29, wherein the combination of the first magnet, the magnet arrangement and the second magnet is configured to exert between about 50 Newtons and about 500 Newtons of substantially static compressive force to the piezoelectric transducer.

34. The apparatus of claim 29, wherein the combination of the first magnet, the magnet arrangement and the second magnet is configured to exert between about 5 Newtons and about 50 Newtons of substantially static compressive force to the piezoelectric transducer.

35. The apparatus of claim 33, wherein the static compressive force and the movement of the piezoelectric transducer are aligned in a same axial direction.

36. A watercraft comprising the apparatus of claim 1 mounted on the watercraft to project vibration energy from the watercraft during use of the watercraft.

37. The apparatus of claim 1, further comprising an impedance matching layer disposed at an outer end of the second magnet.

38. The apparatus of claim 1, further comprising an acoustic lens disposed at an outer end of the second magnet.

* * * * *